(12) United States Patent
Howieson et al.

(10) Patent No.: US 10,460,992 B2
(45) Date of Patent: *Oct. 29, 2019

(54) HIGH FREQUENCY ATTENUATOR

(71) Applicant: Thin Film Technology Corporation, North Mankato, MN (US)

(72) Inventors: Michael James Howieson, Good Thunder, MN (US); Mitchell Andrew Hansen, Mankato, MN (US); Mark Hamilton Broman, Mankato, MN (US)

(73) Assignee: THIN FILM TECHNOLOGY CORPORATION, North Mankato, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/181,887

(22) Filed: Nov. 6, 2018

(65) Prior Publication Data

US 2019/0214303 A1 Jul. 11, 2019

Related U.S. Application Data

(63) Continuation of application No. 15/866,015, filed on Jan. 9, 2018, now Pat. No. 10,153,208.

(51) Int. Cl.
*H01L 21/822* (2006.01)
*H01P 1/22* (2006.01)
*H03H 7/24* (2006.01)

(52) U.S. Cl.
CPC ............ *H01L 21/822* (2013.01); *H01P 1/22* (2013.01); *H01P 1/227* (2013.01); *H03H 7/24* (2013.01)

(58) Field of Classification Search
CPC .......... H01L 21/822; H01P 1/22; H01P 1/227; H03H 7/24

(Continued)

(56) References Cited

U.S. PATENT DOCUMENTS 2,909,736 A 10/1959 Sommers et al.
4,107,632 A 8/1978 Dawson
(Continued)

FOREIGN PATENT DOCUMENTS

CN 102403560 B 10/2016
TW 200905968 A 2/2009
TW 201735433 A 10/2017

OTHER PUBLICATIONS

International Patent Application No. PCT/US2018/012958, International Search Report and Written Opinion dated May 14, 2018, 7 pages.

(Continued)

*Primary Examiner* — William Hernandez
(74) *Attorney, Agent, or Firm* — Fredrikson & Byron, P.A.

(57) ABSTRACT

High-frequency thin film chip attenuators can include a substrate having a first side and a second side, a first portion coupled to the first side of the substrate, and a second portion coupled to the second side of the substrate. The first portion can include a ground section, an input contact section, and an output contact section. The second portion can include a ground section, an input section, an output section, and a plurality of resistive sections providing electrical communication between the input section, the output section, and the ground section. The resistive sections can be arranged in an attenuation configuration to attenuate a signal received at the input section and output via the output section. A plurality of through-holes extending through the substrate can provide electrical communication between sections on the first side of the substrate and associated sections on the second side of the substrate.

20 Claims, 13 Drawing Sheets

(58) Field of Classification Search
USPC .......................................................... 327/308
See application file for complete search history.

(56) References Cited

U.S. PATENT DOCUMENTS

| | | | | |
|---|---|---|---|---|
| 5,387,888 | A * | 2/1995 | Eda | H01L 23/66 257/664 |
| 6,373,348 | B1 * | 4/2002 | Hagerup | H01L 23/3677 257/E23.105 |
| 7,154,371 | B1 * | 12/2006 | Balzano | H01C 1/014 338/22 SD |
| 8,604,892 | B2 | 12/2013 | Ikuma | |
| 2003/0132813 | A1 * | 7/2003 | Gottschalk | H01P 1/227 333/81 A |
| 2009/0231068 | A1 | 9/2009 | Das et al. | |
| 2011/0084784 | A1 * | 4/2011 | Das | H01P 1/22 333/81 A |
| 2011/0298569 | A1 * | 12/2011 | Tzuang | H01P 1/20345 333/81 R |
| 2013/0169386 | A1 | 7/2013 | Matono et al. | |
| 2015/0155848 | A1 * | 6/2015 | Yazaki | H01P 1/20345 333/116 |
| 2017/0257074 | A1 * | 9/2017 | Yeh | G06N 99/00 |

OTHER PUBLICATIONS

"ATC 504L Series UBR Ultra-Broadband Resistors," American Technical Ceramics, ATC # 001-1108, Rev C, Aug. 2013, 2 pages.
"ATC AT Series 0603 RF/Microwave Attenuator," American Technical Ceramics, ATC # 001-1149, Rev C, Sep. 2017, 3 pages.
"ATC HVR Series Resistors," American Technical Ceramics, ATC # 001-1110, Rev A, May 2012, 2 pages.
"Chip Resistors, Style CR1," American Technical Ceramics, ATC # 001-944, Rev U, Nov. 2014, 1 page.
"Surface Mount Chip Resistors, Style CS1 and Style CW," American Technical Ceramics, Excerpt from ATC # 001-944, Rev U, Nov. 2014, 1 page.
"Chip Terminations, Style CT1," American Technical Ceramics, Excerpt from ATC # 001-944, Rev U, Nov. 2014, 1 page.
"Surface Mount Chip Terminations, Style CZ1," American Technical Ceramics, Excerpt from ATC # 001-944, Rev T, Jun. 2014, 2 pages.
"High Power Flange Mount Attenuators, Style FA1," American Technical Ceramics, Excerpt from ATC # 001-944, Rev U, Nov. 2014, 2 pages.
"Resistors," American Technical Ceramics, Excerpt from ATC # 001-944, Rev U, Nov. 2014, 7 pages.
"Terminations," American Technical Ceramics, Excerpt from ATC # 001-944, Rev W, Sep. 2017, 15 pages.
"High Power Leaded Chip Attenuators, Style LA1," American Technical Ceramics, Excerpt from ATC # 001-944, Rev U, Nov. 2014, 2 pages.
"Leaded Chip Resistors, Style LR1," American Technical Ceramics, Excerpt from ATC # 001-944, Rev U, Nov. 2014, 1 page.
"Leaded Chip Terminations, Style LT1," American Technical Ceramics, Excerpt from ATC # 001-944, Rev U, Nov. 2014, 1 page.
"High Power Resistive Products," American Technical Ceramics, ATC # 001-944, Rev W, Sep. 2017, 64 pages.
"ATC WBR Series Wire Bond Resistors (Top Contact/Bottom Isolated)," American Technical Ceramics, ATC # 001-1109, Rev C, Jun. 2017, 2 pages.
"Resistors," American Technical Ceramics, ATC # 001-1067, Rev D, Aug. 2012, 1 page.
"New Product Announcement from ATC: ATC Offers New Additions to AT Series RF / Microwave Attenuators," American Technical Ceramics, Sep. 19, 2017, 1 page.

* cited by examiner

HIGH FREQUENCY ATTENUATOR

CROSS REFERENCE TO RELATED APPLICATION

This application is a continuation application of U.S. application Ser. No. 15/866,015, filed Jan. 9, 2018. The entire content of this application is incorporated herein by reference.

BACKGROUND

Passive chip attenuators are generally used to attenuate signals in a circuit. Various attenuator designs can be used, for example, including different configurations and/or values of resistors in an attenuator circuit design. Such chips often include an attenuator circuit on top side of the chip and a grounding bar on the bottom side of the chip in order to provide a ground signal to the attenuator circuit. Wrap-around contacts generally travel from the bottom side of the chip to the top side by wrapping around the perimeter edge of the chip, permitting the electrical communication of ground and signal from the bottom side of the chip to the attenuator circuit.

Such designs can lead to poor operating quality for attenuators, particularly when attenuating high frequency signals. For example, too narrow of a ground strip can lead to impedance matching issues when attenuating high frequency signals. Impedance mismatch issues at high frequencies can cause signal reflections or other errors, leading to unpredictable and/or undesirable attenuator operation. In addition, many attenuators use only a single ground launch from a circuit board into the attenuator and utilize a single ground trace in a ground-signal (G-S) configuration, which can lead to various signal reflections and losses.

Additionally, wrap-around contacts tend to contribute to impedance matching issues. When attaching a chip with wrap-around contacts to a board, it can be difficult to control the geometry of the solder used for electrically contacting the wrap-around contacts. This can make it difficult to maintain a ground-signal-ground (G-S-G) configuration present on the circuit board when launching from the circuit board (e.g., that includes a G-S-G configuration) to the attenuator circuit. Losing the desired G-S-G configuration, for example, while launching the signal to the chip, can lead to various signal reflections and losses, as well as impedance mismatches, particularly at high frequency operation. Moreover, wrap-around contacts often create 90° angles through which the signal propagates, further contributing to signal reflections and losses, particularly at high frequencies. Additionally, wrap-around contacts can require fabrication techniques separate from those used to construct the rest of the attenuator, such as different material deposition techniques, and can be difficult to construct uniformly, leading to increased cost and time necessary for attenuator fabrication.

Single ground-signal (G-S) configurations combined with common wrap-around contacts can compound the issues that arise in each case when attenuating high frequency signals.

Such design characteristics often limit the high-frequency performance of chip attenuators. Said differently, such characteristics limit the frequency range that such attenuator chips can operate within the desired operating parameters (e.g., amount of desired attenuation). Currently, attenuator chips struggle to operate consistently at frequencies greater than approximately 18 GHz. Thus, as higher frequency signals become more ubiquitous, improvement in attenuator operation at higher frequencies will be needed.

SUMMARY

Aspects of the disclosure are generally directed toward chip attenuators, and in some examples, thin-film chip attenuators, and methods of making the same. Some embodiments include a substrate comprising a substrate material having a first side and a second side, the second side being opposite the first. A first portion of the attenuator can be coupled to the first side of the substrate including an input contact section, an output contact section, and a ground section, wherein there are no electrically conductive paths between the input contact section, the output contact section, and the ground section on the first side of the substrate. In some examples, such a first portion forms the bottom side of a chip attenuator, and can be mounted to a circuit board. A signal from the circuit board can be received via the input contact section, and the ground signal from the circuit board can be received at the ground section of the first portion. The ground section on the first side of the substrate can be sufficiently large to reduce signal reflections and losses, and to maintain a desired input impedance at high frequencies.

A second portion of the attenuator can be coupled to the second side of the substrate. The second portion can include a first ground section positioned along a first edge of the second side of the substrate and an attenuation section. The attenuation section can include an input section, an output section, and a plurality of resistive sections providing electrical communication between the input section, the output section, and the first ground section. The resistive sections can be arranged in a plurality of attenuator configurations, such as "tee," "pi," and "dual pi" attenuator configurations.

In some examples, a chip attenuator including such first and second portions can include a plurality of through-holes extending through the substrate and providing electrical communication between the first side of the substrate and the second side of the substrate. In some such examples, the input contact section of the first portion is in electrical communication with the input section of the attenuation section of the second portion via one or more through-holes. Similarly, in some examples, the output contact section of the first portion is in electrical communication with the output section of the attenuation section of the second portion via one or more through-holes. Additionally or alternatively, in some examples, the ground section of the first portion is in electrical communication with the first ground section of the second portion via one or more through-holes.

During operation, a high-frequency signal can be received from a circuit board at the input contact section of the first portion and communicated to the input section of the second portion by one or more through-holes. The signal can be attenuated via one or more resistive sections in the attenuation section, and communicated from the output section of the second portion to the output contact section of the first portion via one or more through-holes. The attenuated signal can be communicated to the circuit board via the output contact section.

The plurality of through-holes can provide electrical communication between the first and second sides of the substrate. In some embodiments, through-holes provide electrical communication between a bottom side of a chip attenuator, configured for mounting onto a circuit board, to a top side of the chip attenuator, including the attenuating circuitry. Such through-hole communication can eliminate the high-frequency propagation issues and fabrication difficulties associated with the traditional wrap-around contacts.

In some examples, various sections of chip attenuators can be constructed using a plurality of thin-film layers. In some examples, thin-film layers comprise a resistive layer and a conductive layer. In some examples, the plurality of resistive sections includes only the resistive layer, while other sections include the conductive layer, for example, in a stack of thin-film materials that also includes the resistive layer.

In some examples, the same thin-film stacks of materials are deposited on the first side and second side of the substrate simultaneously in order to efficiently construct the attenuator. Various additional fabrication techniques can be used, for instance, such as masking, etching, and plating, in order to create the various sections of the attenuator, such as the resistive sections, ground sections, and the like.

DETAILED DESCRIPTION

Figure 1:
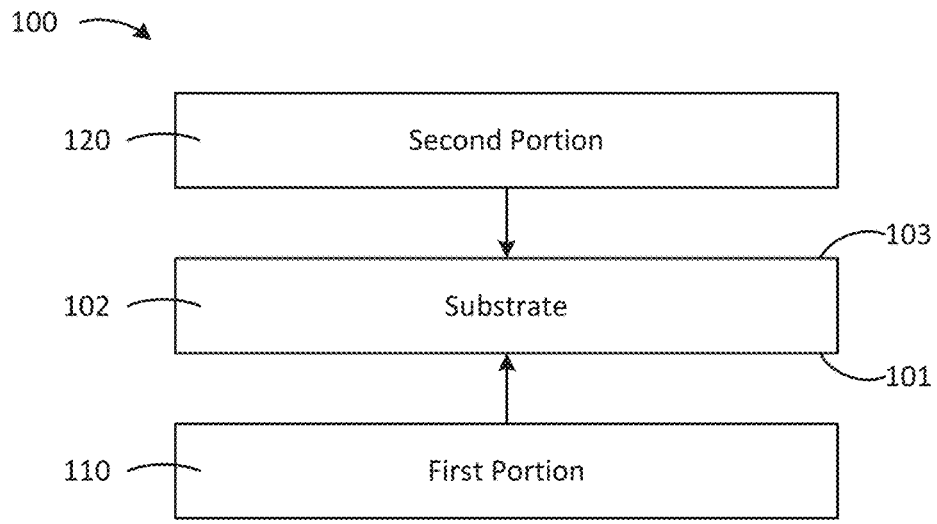
FIG. 1 shows a simple diagram of an exemplary chip attenuator.

FIG. 1 shows a simple diagram of an exemplary chip attenuator. The attenuator 100 includes a substrate 102 having a first side 101 and a second side 103. The attenuator 100 includes a first portion 110 coupled to the first side 101 of the substrate 102 and a second portion 120 coupled to the second side 103 of the substrate 102. In some embodiments, the first portion 110 includes sections configured to contact a circuit, for example, on a circuit board, for receiving a signal for attenuation and for outputting an attenuated signal. In some embodiments, the second portion 120 of the attenuator 100 includes one or more resistive sections arranged to provide desired attenuation of the signal received via the first portion 110 of the attenuator 100.

Figure 2A:
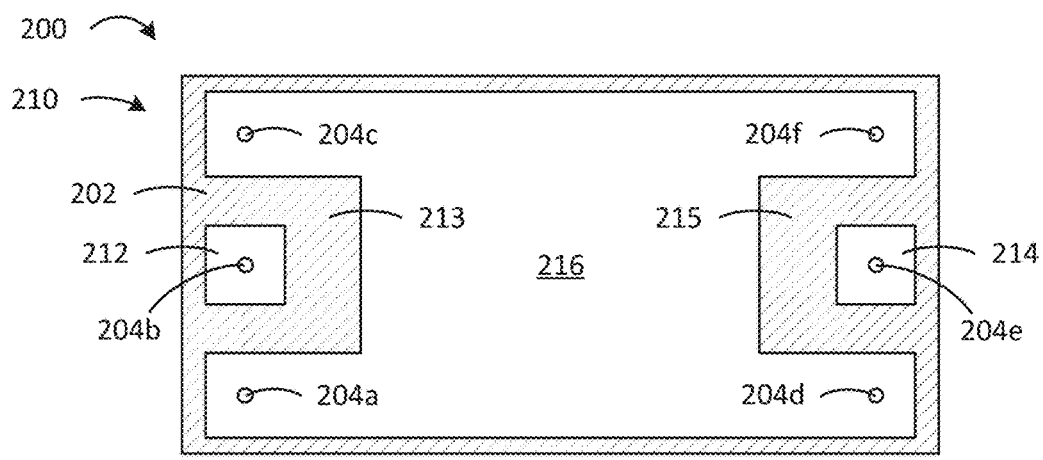
FIG. 2A shows a simplified plan view showing a first portion of an attenuator coupled to the first side of a substrate.

FIG. 2A shows a simplified plan view showing a first portion of an attenuator coupled to the first side of a substrate. In the illustrated example, the first portion 210 includes an input contact section 212, an output contact section 214, and a ground section 216. In some examples, the chip attenuator 200 is configured to be surface mounted onto a circuit board via the first portion 210, such as in a land grid array. For example, in some embodiments, the input contact section 212 can contact part of a circuit board including an input signal to be attenuated and the output contact section 214 can contact part of the circuit board to receive the attenuated signal. Similarly, the ground section 216 can contact a ground signal provided by the circuit board.

In an exemplary mounting configuration, a circuit board has a ground-signal-ground (G-S-G) configuration, wherein the signal trace is bordered on each side with a ground trace. In some embodiments, to make electrical contact to such a configuration, the input contact section 212 contacts the signal trace on the circuit board, while the parts of the ground section 216 on either side of the input contact section 212 contact the ground traces on either side of the signal trace. Thus, the G-S-G configuration of the circuit board continues through the launch of the signal (and ground) from the board to the chip attenuator mounted thereon. Maintaining the G-S-G configuration into the attenuator can promote impedance matching, good high-frequency performance, and reduced return losses during attenuator operation (particularly during attenuation of high-frequency signals, for example, up to or greater than 30 GHz). In an exemplary embodiment, the G-S-G configuration provided by the input contact section 212 and the surrounding parts of the ground section 216 in the first portion 210 of the attenuator 200, when contacting a corresponding G-S-G trace on a circuit board, provides a 50Ω input impedance to match the existing circuit parameters.

In the illustrated example of FIG. 2A, the first portion 210 of the attenuator 200 includes isolating sections 213 and 215. In the illustrated example, isolating sections 213, 215 are sections in which the substrate 202 does not include additional material disposed thereon. Isolating section 213 provides electrical isolation, at least on the first side of the substrate 202, between the input contact section 212 and the ground section 216. Similarly, isolating section 215 provides electrical isolation, at least on the first side of the substrate 202, between the output contact section 214 and the ground section 216. As a result, in the illustrated embodiment, there are no electrically conductive paths between the input contact section 212, the output contact section 214, and the ground section 216 on the first side of the substrate 202.

In some embodiments, isolating section 213 separates the input contact section 212 from the ground section 216 by a predetermined distance to prevent undesired communication between the input contact section 212 and the ground section 216. Similarly, in some examples, isolating section 215 separates the output contact section 214 from the ground section 216 by a predetermined distance to prevent undesired communication between the output contact section 214 and the ground section 216. In some embodiments, the distance is minimized to maximize the area of the ground portion 216 while maintaining sufficient isolation between the ground section 216 and the input 212 and output 214 contact sections. Maximizing the area of the ground section 216 can help maintain a desired input and/or output impedance of the attenuator and reduce signal reflections and losses during high frequency operation.

As shown in the example of FIG. 2A, the attenuator 200 includes through-holes 204a, 204b, 204c, 204d, 204e, and 204f. One or more such through-holes 204a-f can extend through the attenuator 200, for example, to electrically connect parts of the first portion 210 one the first side of the substrate to parts of the second portion on the second side of the substrate. In some embodiments, such as shown in FIG. 2A, through-holes 204a-f extend through the attenuator 200 at locations removed from the periphery of the attenuator. Alternatively, in some examples, one or more of (and in some embodiments, up to all) through-holes 204a-204f are positioned along a peripheral edge of the attenuator 200 such that the perimeter of the attenuator 200 intersects such one or more through-holes. In some such examples, one or more such through-holes comprises a semi-circular cross-sectional shape (e.g., from a plan view perspective).

Figure 2B:
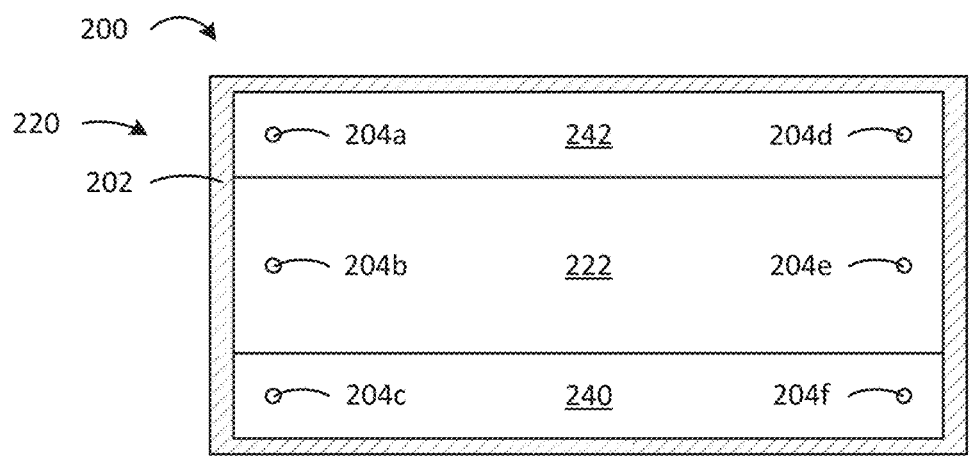
FIG. 2B shows a simplified plan view showing a second portion of an attenuator coupled to the second side of a substrate.

FIG. 2B shows a simplified plan view showing a second portion of an attenuator coupled to the second side of a substrate. In the illustrated example, the second portion 220 of the attenuator 200 includes a first ground section 240, a second ground section 242, and an attenuation section 222 positioned between the first ground section 240 and the second ground section 242. In various examples, the attenuation section can include an input section, an output section, and a plurality of resistive sections. The plurality of resistive sections can provide electrical communication between the input section, the output section, and at least one of the first ground section 240 and the second ground section 242 as will be described elsewhere herein. The resistive section can be configured to provide desired attenuation between the input contact section 212 and the output contact section 214 of the first portion 210 of the attenuator 200.

In some examples, as a signal propagates through and is attenuated by the attenuation section 222, the first ground section 240 and second ground section 242 provide/maintain a G-S-G configuration with respect to the current path through the attenuator 200. This can improve attenuator performance when attenuating high frequency signals (e.g., signals with frequency up to 30 GHz), for example, by reducing return loss and impedance matching issues, for example, as described elsewhere herein. In some embodiments, as the signal propagates through the attenuation section 222, the ground section 216 in the first portion 210 of the attenuator 200 opposite the attenuation section 222 can maintain a steady and desired input impedance and/or output impedance for the attenuator (e.g., approximately 50Ω).

As further shown in the embodiment of FIG. 2B, through-holes 204a-f extend through from the first portion 210 of the attenuator 200 to the second portion 220 of the attenuator 200. In some embodiments, the through-holes 204a-f can include an electrically conductive coating and provide electrical communication between various sections of the first portion 210 and the second portion 220 of the attenuator 200. For example, with respect to FIGS. 2A and 2B, through-hole 204b can provide electrical communication between the input contact section 212 of the first portion 210 and the attenuation section (e.g., an input section) 222 of the second portion 220. Similarly, through-hole 204a can provide electrical communication between the second ground section 242 of the second portion 220 and the ground section 216 of the first portion.

Figure 3A:
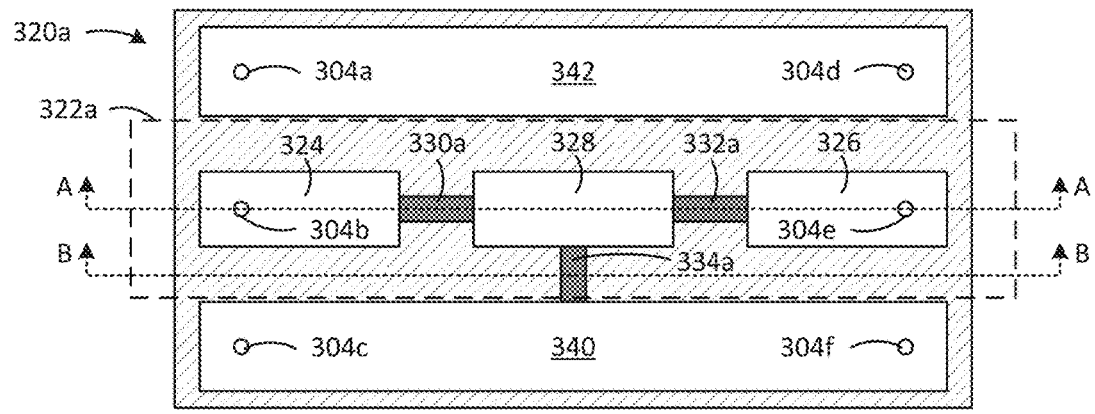
FIGS. 3A, 3B, and 3C show exemplary plan views of a second portion of attenuators according to different embodiments.
Figure 3B:
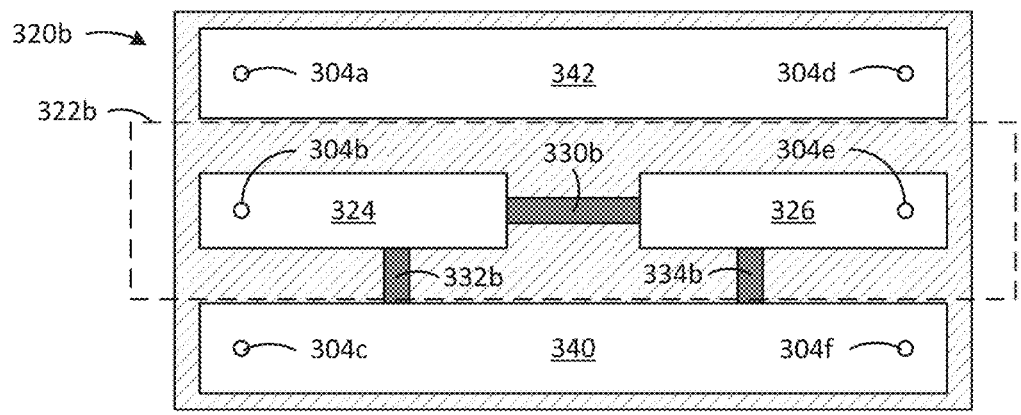
Figure 3C:
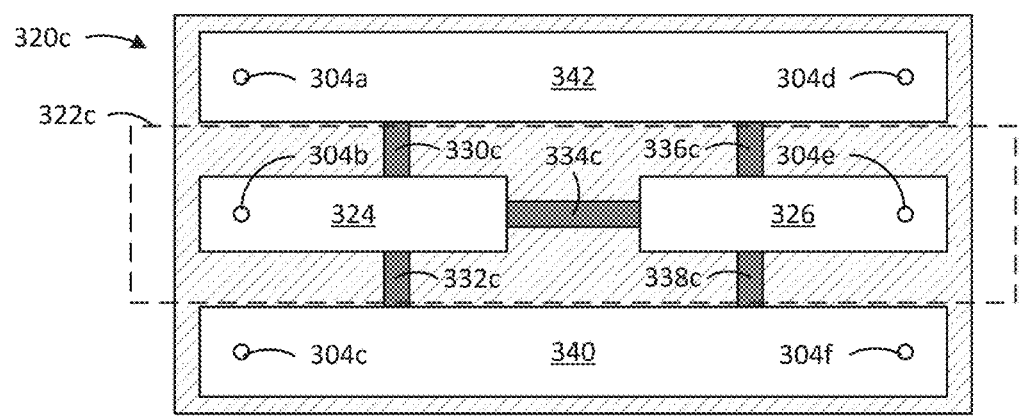

FIGS. 3A, 3B, and 3C show exemplary plan views of a second portion of attenuators according to different embodiments. FIG. 3A shows a second portion 320a of an attenuator having a first ground section 340, a second ground section 342, and an attenuation section 322a positioned between the first ground section 340 and the second ground section 342. In the example of FIG. 3A, the attenuation section 322a includes an input section 324, an output section 326, and a plurality of resistive sections 330a, 332a, and 334a arranged in a "tee" attenuator configuration. In particular, a first resistive section 330a is provided between the input section 324 and an intermediate section 328. A second resistive section 332a is provided between the intermediate section 328 and the output section 326, and a third resistive section 334a is provided between the intermediate section 328 and the first ground section 340.

In some embodiments, the resistive sections 330a, 332a, 334a comprise a different material and/or stack of materials than do other sections, such as the input section 324, the output section 326, and the intermediate section 328. This distinction in material can lead to resistive properties of the resistive sections 330a, 332a, 334a, while other sections (e.g., input section 324, output section 326, intermediate section 328, first ground section 340, etc.) are comparatively less resistive.

FIG. 3B shows a second portion 320b of an attenuator having a first ground section 340, a second ground section 342, and an attenuation section 322b positioned between the first ground section 340 and the second ground section 342. In the example of FIG. 3B, the attenuation section 322b includes an input section 324, an output section 326, and a plurality of resistive sections 330b, 332b, and 334b arranged in a "pi" attenuator configuration. In particular, a first resistive section 330b is provided between the input section 324 and the output section 326. A second resistive section 332b is provided between the input section 324 and the first ground section 340, and a third resistive section 334b is provided between the output section 326 and the first ground section 340.

Similar to the resistive sections 330a, 332a, 334a described with respect to FIG. 3A, resistive sections 330b, 332b, 334b can comprise a different material and/or stack of materials than other sections, such as the input section 324, the output section 326, and the intermediate section 328. This distinction in material can lead to resistive properties of the resistive sections 330b, 332b, 334b, while other sections (e.g., input section 324, output section 326, first ground section 340, etc.) are comparatively less resistive.

FIG. 3C shows a second portion 320c of an attenuator having a first ground section 340, a second ground section 342, and an attenuation section 322c positioned between the first ground section 340 and the second ground section 342. In the example of FIG. 3C, the attenuation section 322c includes an input section 324, an output section 326, and a plurality of resistive sections 330c, 332c, 334c, 336c, and 338c arranged in a "dual pi" attenuator configuration. In particular, a first resistive section 330c is provided between the input section 324 and the second ground section 342. A second resistive section 332c is provided between the input section 324 and the first ground section 340. A third resistive section 334c is provided between the input section 324 and the output section 326. A fourth resistive section 336c is provided between the output section 326 and the second ground section 342. A fifth resistive section 338c is provided between the output section 326 and the first ground section 340.

Similar to the resistive sections 330a, 332a, 334a described with respect to FIG. 3A, resistive sections 330c, 332c, 334c, 336c, and 338c can comprise a different material and/or stack of materials than other sections, such as the input section 324, the output section 326, and the intermediate section 328. This distinction in material can lead to resistive properties of the resistive sections 330c, 332c, 334c, 336c, 338c while other sections (e.g., input section 324, output section 326, first ground section 340, etc.) are comparatively less resistive.

The exemplary attenuators shown in FIGS. 3A-3C include a plurality of through-holes 304a, 304b, 304c, 304d, 304e, 304f that can facilitate communication between the illustrated sections in the second portion (320a, 320b, 320c) of the attenuator to various sections in a first portion of an attenuator (e.g., first portion 210 in FIG. 2A). Additionally, as described with respect to FIG. 2B, the first ground section 340 and the second ground section 342 positioned on either side of attenuation sections (322a, 322b, 322c) can provide a G-S-G attenuator configuration to facilitate uniform attenuation of high frequency signals.

In some examples, one of the first ground section 340 and second ground section 342 can be omitted. For example, in the "tee" and "pi" attenuators shown in FIGS. 3A and 3B, respectively, the second ground section 342 could be excluded from the second portion 320 of the attenuator 300 while still retaining the desired configuration of resistive sections (330, 332, etc.). Thus, the attenuation section (e.g., 322a) can include an input section (e.g., 324a), an output section (e.g., 326a) and a plurality of resistive sections (e.g., 330a, 332a, 334a) providing electrical communication between the input section, the output section, and the first ground section (e.g., 340). In some such examples, while the second portion 320 of the attenuator 300 does not itself include separate ground sections to form a G-S-G configuration, the G-S-G launch of the signal into the first portion of the attenuator (e.g., via input contact section 214 and ground section 216 shown in FIG. 2A) may provide the benefits of the G-S-G configuration with respect to overall attenuator operation.

In the illustrated examples of FIGS. 3A-3C, sections of the second portion 320a, 320b, 320c that do not include the input section 324, the output section 326, the resistive sections (e.g., 330a, 332a, etc.), or the intermediate section 328 are shown as only including the substrate, shown in a cross-hatched pattern (referred to as substrate sections). That is, in various examples, material can be absent from the surface of the substrate in locations of the attenuator in order to limit current flow between various sections of the attenuator. For example, with respect to FIG. 3A, a bare substrate section is shown between the input section 324 and the first ground section 340 in order to limit the electrical path therebetween to the path through the first resistive section 330a, the intermediate section 328, and the third resistive section 334a.

Figure 4A:
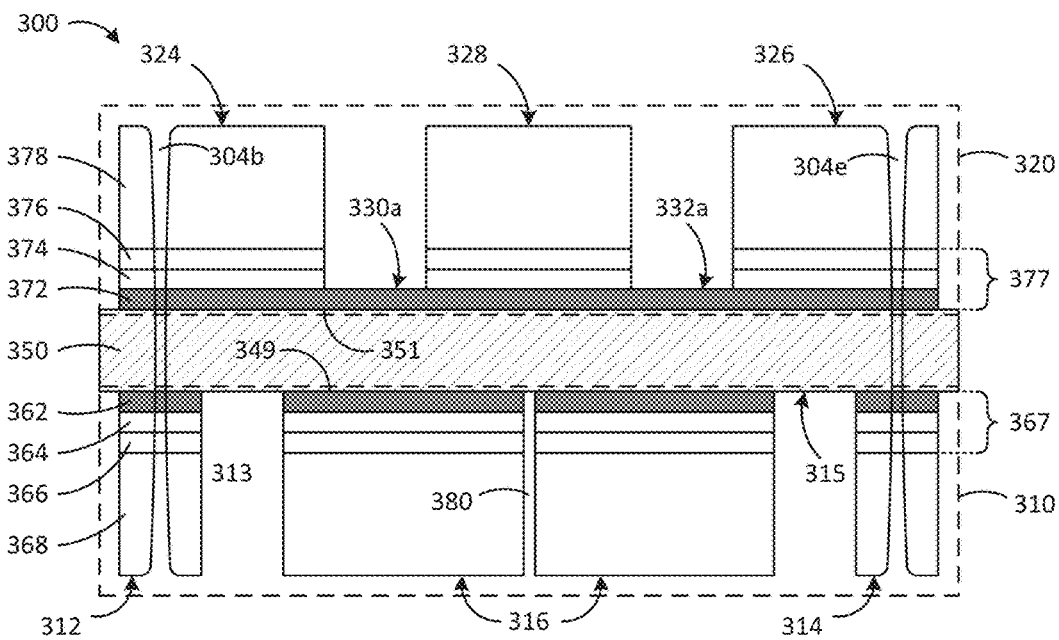
FIGS. 4A and 4B are cross-sectional views of the "tee" attenuator shown in FIG. 3A taken at lines A-A and B-B, respectively.
Figure 4B:
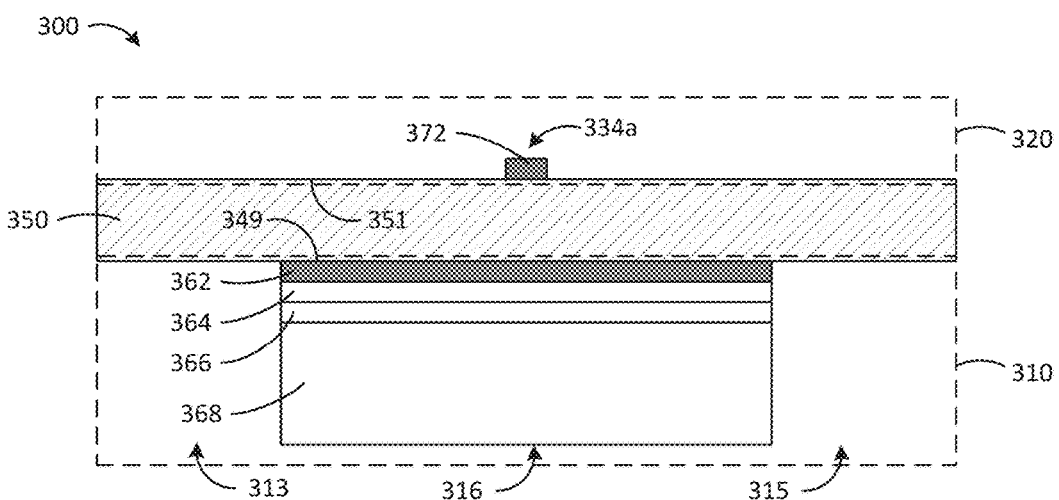

As described, different sections in the attenuator can include different materials and/or layers of materials that can be used to control the resistive properties of the attenuator. In some embodiments, the resistive sections (e.g., 330a, 332a, etc.) can include a subset of the material present in the remaining sections. FIGS. 4A and 4B are cross-sectional views of the "tee" attenuator shown in FIG. 3A taken at lines A-A and B-B, respectively.

In the illustrated examples in FIGS. 2A, 2B, and 3A-3C, the attenuators 200, 300 are arranged to be approximately symmetric in the direction of signal propagation through the device. That is, the attenuator can be placed on a circuit board for attenuating a signal in either direction. However, in various implementations, attenuators need not be symmetric, for example, with respect to layout (e.g., locations of resistive sections 330, 332, etc.) and/or characteristics (e.g., resistance values at resistive sections 330, 332, etc.).

FIG. 4A shows an attenuator 300 including a substrate 350 having a first side 349 and a second side 351. In some examples, the substrate 350 comprises a smooth material having a substantially uniform thickness. Such properties can be useful to maintain approximately uniform impedance and dielectric properties across the substrate and minimize return loss. In some examples, the substrate 350 comprises an electrically insulating material and/or an electrically insulating coating.

In some embodiments, substrate 350 comprises an alumina substrate. In some examples, the substrate comprises 99.6% pure alumina. In other examples, substrate can be made from other materials, such as aluminum nitride (AlN), zirconium, silicon (Si), diamond, or the like. In various examples, the substrate can be a variety of thicknesses. In some embodiments, the substrate can be less than approximately 650 microns (µm) thick, less than approximately 400 µm thick, less than approximately 300 µm thick, or less than approximately 200 µm thick. In some embodiments, the substrate can be 180 µm thick. Other thicknesses may also be used.

The attenuator 300 includes a first portion 310 coupled the first side 349 of the substrate 350 and a second portion 320 coupled to the second side 351 of the substrate 350. The first portion 310 includes an input contact section 312, an output contact section 314, and a ground section 316. In some embodiments, the ground section 316 can include a cut 380 separating the ground section 316 into separate sections. Separating the ground section 316 into separate sections can be useful, for example, for testing, trimming, and manufacturability purposes, such as providing an ability to electrically isolate various resistive sections (e.g., 332b, 334b in FIG. 3B) during testing to ensure each section operates as intended. In some examples, surface mounting an attenuator chip to a PCB board comprises using solder or solder paste to mechanically and electrically couple the chip to the PCB. Such solder or solder paste can electrically couple ground sections separated by cut 380 in order to effectively create a single continuous ground section 316. In some designs, a continuous ground section 316 provides electrical coupling of various ground sections (e.g., 340, 342) in the second portion.

In the illustrated example, the first portion includes a plurality of layers that make up the input contact section 312, the ground section 316, and the output contact section 314. In some embodiments, the layers include a resistive layer 362, a barrier layer 364, and a conductive layer 366. In various embodiments, each of the resistive layer 362, the barrier layer 364, and the conductive layer 366 is a thin-film layer, for example, deposited via one or more thin-film deposition techniques, such as sputtering. In some embodiments, the resistive layer 362, the barrier layer 364, and the conductive layer 366 together make up a stack 367 of thin-film layers. In some embodiments, the stack 367 of thin-film layers totals approximately 2000 Angstroms. In some examples, the stack of thin-film layers totals less than 2000 Angstroms.

In an exemplary embodiment, the resistive layer 362 comprises a resistive material, such as nickel chromium (NiCr), tantalum nitride (TaN) or the like. Similarly, the conductive layer 366 could include any of a plurality of conductive materials, such gold, silver, copper, or the like. In some embodiments, the barrier layer 364 prevents contamination of the resistive layer 362 from the conductive layer 366, and can be selected based on the materials used in the resistive layer 362 and the conductive layer 366. For instance, in an exemplary embodiment, the resistive layer 362 comprises nickel chromium and the conductive layer 366 comprises copper, which can leach into and degrade nickel chromium over time. In some such examples, barrier layer 364 comprises nickel, and acts to prevent copper from contaminating the nickel chromium resistive layer 362. Thus, the barrier layer 364 can prevent degradation of the resistive layer 362 over time. In some embodiments, barrier layer 364 can be omitted, for example, if the resistive layer 362 and conductive layer 366 materials are compatible and/or to save manufacturing time and cost.

The first portion 310 further includes a plated layer 368 on the stack 367 of thin-film materials. The plated layer 368 can include a copper plated layer. In some embodiments, the plated layer 368 is significantly thicker than any of the thin-film resistive layer 362, barrier layer 364, and conductive layer 366, and can reduce losses due to a skin effect of thin-film layers (e.g., stack 367).

In the illustrated embodiment, the first portion 310 includes isolating sections 313 and 315 separating the ground section 316 from the input contact section 312 and the output contact section 314, respectively. As shown, none of the layers 362, 364, 46, 368 is continuous across the isolating sections 313, 315. Accordingly, there are no electrically conductive paths between the input contact section 312, the output contact section 314, and the ground section 316 on the first side 349 of the substrate 350. As can be seen, in the illustrated example the substrate 350 would be visible in isolating sections 313 and 315 in a in a plan view of the first portion 310 of the attenuator 300.

Similar to as shown in FIG. 3A, the second portion 320 coupled to the second side 351 of the substrate includes an input section 324, an intermediate section 328, and an output section 326. The second portion 320 further includes a first resistive section 330a coupling the input section 324 and the intermediate section 328, and a second resistive section 332a coupling the intermediate section 328 and the output section 326 (such as shown in the "tee" configuration of FIG. 3A).

In the example of FIG. 4A, the input section 324, the output section 326, and the intermediate section 328 include a plurality of layers. In some embodiments, the layers include a resistive layer 372, a barrier layer 374, and a conductive layer 376. In various embodiments, each of the resistive layer 372, the barrier layer 374, and the conductive layer 376 is a thin-film layer, for example, deposited via one or more thin-film deposition techniques, such as sputtering. In some embodiments, the resistive layer 372, the barrier layer 374, and the conductive layer 376 together make up a stack 377 of thin-film layers.

Similar to the first portion 310 of attenuator 300, in an exemplary embodiment, the resistive layer 372 comprises a resistive material, such as nickel chromium (NiCr), tantalum nitride (TaN) or the like. In some embodiments, the barrier layer 374 comprises a nickel (Ni) layer. In still further embodiments, the conductive layer 376 comprises a copper (Cu) layer. In some such embodiments, the barrier layer 374 prevents contamination of the resistive layer 372 from the conductive layer 376. The second portion 320 further includes a plated layer 378 on the stack 377 of thin-film materials. The plated layer 378 can include a copper plated layer. In some embodiments, the plated layer 378 is significantly thicker than any of the thin-film resistive layer 372, barrier layer 374, and conductive layer 376 and can reduce loss due to a skin effect of thin-film layers (e.g., stack 377).

In the illustrated embodiment of FIG. 4A, each of the input section 324, the intermediate section 328, and the output section 326 each includes the thin-film stack 377 of the resistive layer 372, the barrier layer 374, and the conductive layer 376, as well as plated layer 378. However, the first resistive section 330a and the second resistive section 332a include only the resistive layer 372 on the second side 351 of substrate 350. Thus, a signal propagating from the input section 324 to the output section 326 travels through a thin-film resistive layer 372 in resistive sections 330a and 332a. The backing ground section 316 opposite the propagating signal can provide a steady input impedance and/or output impedance (e.g., at approximately 50Ω) for the attenuator, even during high frequency attenuation.

In the illustrated example, through-holes 304b and 304e extend through the substrate 350 between the first portion 310 and the second portion 320. In some examples, through-hole 304b comprises an electrically conductive coating (e.g., thin-film stack 367 or 377) and provides electrical communication between input contact section 312 of the first portion 310 and the input section 324 of the second portion 320. Similarly, in some embodiments, through-hole 304e comprises an electrically conductive coating (e.g., thin-film stack 367 or 377) and provides electrical communication between output contact section 314 of the first portion 310 and the output section 326 of the second portion 320. In general, through-holes (e.g., 304b, 304e) can provide electrical communication between the first portion 310 on the first side 349 of the substrate 350 and the second portion 320 on the second side 351 of the substrate 350.

In the illustrated example, through-holes 304b and 304e include an hourglass shape and rounded edges at the surfaces of plating layers 368, 378. In some examples, one or both of the hourglass shape and rounded edges are a byproduct of the fabrication process of the through-holes. For example, in an exemplary embodiment, through-holes 304b, 304e are a result of through-holes formed in the substrate 350. In some examples, the through-holes formed in the substrate are approximately hourglass shaped, similar to through-holes 304b, 304e in FIG. 4A, for example, due to the process by which the through-holes are formed in the substrate. In some examples, the through-holes are formed in the substrate due to a laser pulse incident on the substrate 350. The laser pulse can create an hourglass shaped through-hole in the substrate 350 including rounded corners at the first side 349 and second side 351 of substrate 350. Adding layers (resistive layer 362, barrier layer 364, conductive layer 366, plating layer 368, etc.) can result in such layers having a similar hourglass shape and rounded edges at the layer surface. In some such examples, electrical communication between the first portion 310 and the second portion 320 may be provided by conductive paths via through-holes 304b, 304e that do not include right angles through which the current flows, reducing loss during high frequency transmission.

In the cross-sectional view of FIG. 4B, attenuator 300 includes a first portion 310 coupled the first side 349 of the substrate 350 and a second portion 320 coupled to the second side 351 of the substrate 350. At the cross-sectional plane shown in FIG. 4B, the first portion 310 includes ground section 316 as in FIG. 4A, including resistive layer 362, barrier layer 364, conductive layer 366, and plated layer 368. In the plane shown in FIG. 4B, first portion 310 includes isolating sections 313 and 315, however, input contact section 312 and output contact section 314 are not present at the cross-sectional plane at line B-B in FIG. 3A.

In the view of FIG. 4B, the attenuator 300 further includes second portion 320 coupled to the second side 351 of the substrate 350. At the plane shown in FIG. 4B, the second portion 320 includes a third resistive section 334 including only resistive layer 372.

With reference back to FIG. 3A, in some examples, the resistive sections 330*a*, 332*a*, 334*a* can include only a resistive layer (e.g., layer 372 as shown in FIGS. 4A and 4B), and therefore have a sheet resistance dependent on the dimensions of the resistive sections. Accordingly, the sheet resistance of each resistive section 330*a*, 332*a*, 334*a* can be customized by adjusting the dimensions of such resistive sections in order to match the desired attenuation characteristics of attenuator.

Exemplary operation of a "tee" attenuator such as shown in FIGS. 3A, 4A, and 4B will be described with reference to these figures. A chip attenuator 300 can be surface mounted, for example, onto a circuit board, such that input contact section 312 contacts the part of the circuit board that includes the signal to be attenuated and output contact section 314 contacts the part of the circuit board that receives the attenuated signal. Ground section(s) 316 contact a part of the circuit board that is grounded.

The signal to be attenuated is received at the input contact section 312, and is directed to the input section 324 of the second portion 320 via the through-hole 304*b*. The signal does not short from the input contact section 312 to ground section 316 in the first portion 310 of the attenuator 300 since the input contact section 312 and the ground section 316 are separated by isolating section 313.

The signal at input section 324 propagates through attenuation section 322*a* to output section 326, and is attenuated by the "tee" configuration of resistive sections 330*a*, 332*a*, and 334*a* due to the sheet resistance of resistive layer 372 at such sections. The attenuated signal is received from the output section 326 by the output contact section 314 via through-hole 304*e*, and can be communicated to other components on the circuit board via the output contact section 314. The ground section 316 on the first portion 310 generally opposite of the attenuation section 322*a*, as well as the G-S-G configuration in the second portion 320 (including first ground section 340, attenuation section 322*a*, and second ground section 342) can reduce return losses and maintain a desired input and/or output impedance (e.g., approximately 50Ω).

According to such an exemplary embodiment, the through-holes (e.g., 304*b*, 304*e*) allow the attenuator 300 to receive signals at the bottom of the attenuator while allowing for a large ground plane (e.g., ground section 316) on the bottom of the attenuator while transmitting data across the top of the attenuator. Further, such through-holes eliminate the need to transmit data from one side of the attenuator to the other via any wrap-around contacts, which can create operating performance issues, especially at high frequencies, as described elsewhere herein. For example, communication via through-holes can eliminate undesirable and/or unpredictable effects of solder fillets (e.g., impedance mismatch) and right angle current paths associated with wrap-around contacts. Incorporating through-holes rather than wrap-around contacts can further improve fabrication speed and efficiency, for example, eliminating the requirement for separate and/or complex deposition and/or plating techniques required for wrap-around contacts.

In some examples, the stack 377 of thin-film layers coupled to the second side 351 of the substrate 350 is approximately the same (e.g., same composition, thickness, etc.) as the stack 367 of thin-film materials coupled to the first side 349 of the substrate 350. For instance, in an exemplary embodiment, each of resistive layers 362 and 372 comprises a NiCr film, each of barrier layers 364 and 374 comprises a Ni film, each of conductive layers 366 and 376 comprises a Cu film, and each of plated layers 368 and 378 comprises a Cu-plated layer. In some examples, thin-film stacks 367 and 377 can be formed simultaneously, for example, during a thin-film deposition process. This can reduce the time and materials needed to produce a chip attenuator, as various materials can be deposited on both sides of the attenuator simultaneously.

Alternatively, in some embodiments, various layers can be deposited on the first side and second side of the substrate separately. In some such embodiments, with respect to the fabrication shown in FIGS. 4A and 4B, the first portion 310 of the attenuator 300 can exclude the resistive layer 362 and the barrier layer 364, since there are no resistive sections in the first portion of the substrate to make use of the resistive material. Further, with no resistive layer 362, a barrier layer 364 used to protect the resistive layer 362 from the conductive layer 366 may similarly be omitted.

Figure 5:
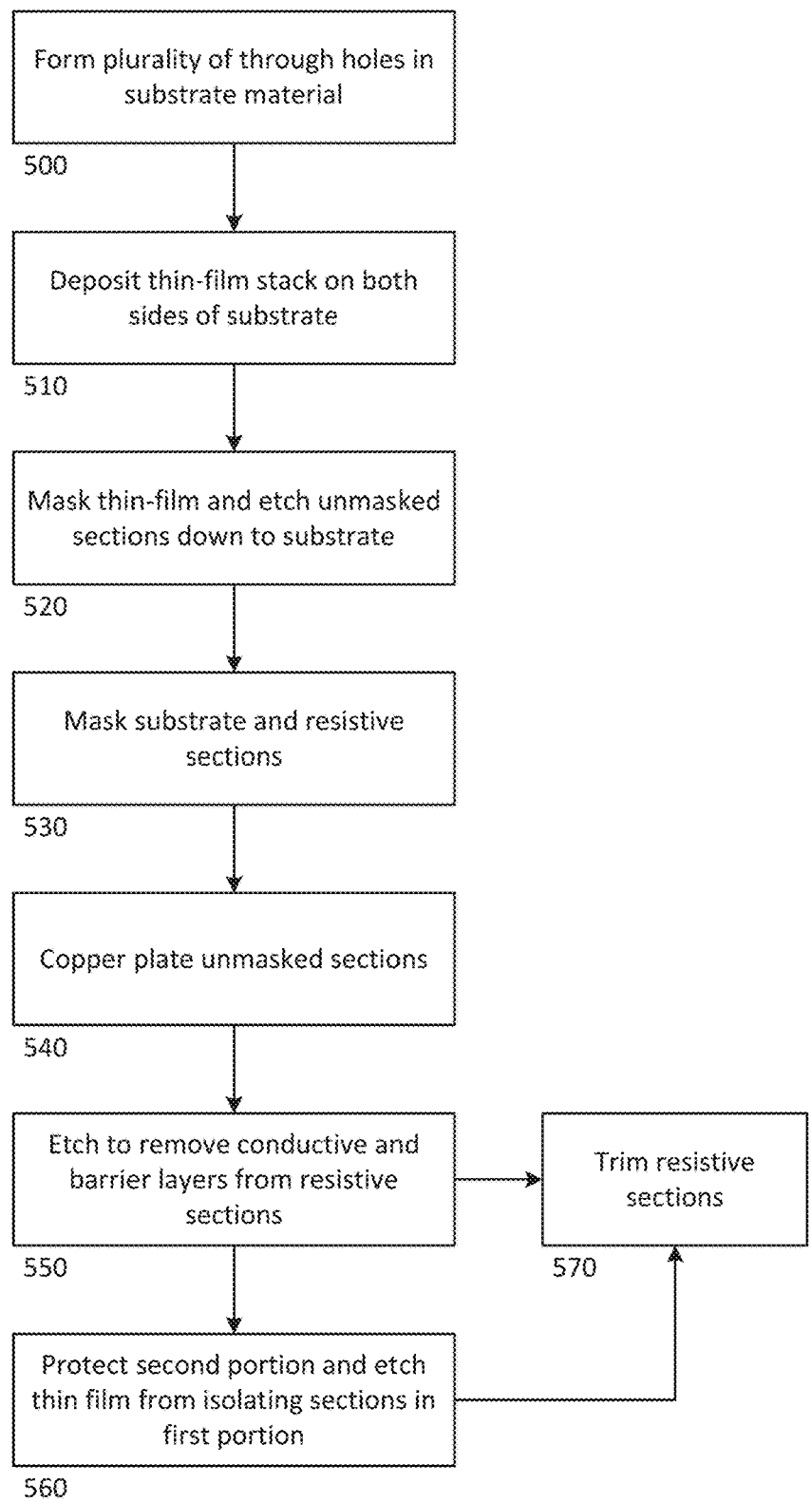
FIG. 5 is a process-flow diagram providing an exemplary method for fabricating a thin-film chip attenuator.

FIG. 5 is a process-flow diagram providing an exemplary method for fabricating a thin-film chip attenuator. The method of FIG. 5 includes forming a plurality of through-holes in a substrate material (500) and depositing a thin-film stack of materials on the substrate (510). In some examples, depositing the thin-film stack comprises depositing a NiCr resistive layer, a Ni barrier layer, and a Cu conductive layer on both sides of the substrate, for example, via a sputtering process. In some embodiments, the sputtering process can be performed on both the first side and the second side of a substrate simultaneously. In some examples, depositing the thin-film stack results in depositing a conductive coating on an interior surface of one or more of the through-holes formed in step 500 to enable conduction of electrical signals through the formed through-holes.

The method further includes the step of masking the thin-film stack, and etching the unmasked sections to remove the stack from various sections of the attenuator (e.g., cross-hatched sections shown in FIG. 3A, isolating sections 213, 215 in FIG. 2A). The method then includes masking the substrate sections and resistive sections (530), for example, the resistive sections 330*a*, 332*a*, 334*a* in FIG. 3A and cross-hatched substrate section and copper plating the unmasked sections (540). For example, with respect to FIG. 3A, the first ground section 340, the second ground section 342, the input section 324, the output section 326, and the intermediate section 328 would be copper plated at step 540, while the remaining sections would be masked from the copper plating.

Next, the mask can be removed, and the attenuator can etched to an etchant that removes the conductive layer and the barrier layer, but not the resistive layer, from the resistive sections (550). For instance, with respect to FIG. 4A, the barrier layer 374 and the conductive layer 376 can be etched away from resistive sections 330*a* and 332*a*, while the resistive layer 372 remains, thereby creating sheet resistors between the input section 324, intermediate section 328, and output section 326. The masking such sections in step 530 would prevent the plated layer 378 from being plated on such sections in step 540, and a sufficiently thick plated layer 378 at the input section 324, the intermediate section 328, and the output section 326 would prevent the etching at step 550 from damaging the conductive layer 376 or the barrier layer 374 in such sections.

In some examples, the step of etching the thin-film stack to the substrate (520) is performed on both the first portion and the second portion of the attenuator, for example, to form substrate section on the second portion and to create isolating sections (e.g., 313, 315) in the first portion. In other examples, such etching is performed on only the second portion, and the stack remains continuous on the first portion. In some such examples, the method includes the step of protecting the second portion of the attenuator and etching the thin-film stack from the isolating sections (e.g., 313, 315) in the first portion (560).

In some examples, the method includes the step of trimming the formed resistive sections (570). This can include, for example, laser trimming the resistive sections so that the resistance of such sections meets a desired resistance. For example, in some cases, laser trimming is more precise than masking and etching. Thus, resistive sections can be made wider than desired during the masking and etching processes, and then trimmed to the desired dimensions to result in the desired dimensions, and therefore resistance.

Figure 6A:
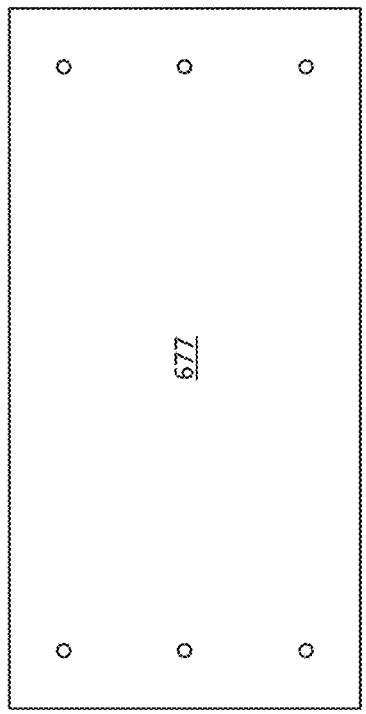
FIGS. 6A-6G show plan views of the second section of an attenuator during a fabrication process similar to that described with respect to FIG. 5.
Figure 6B:
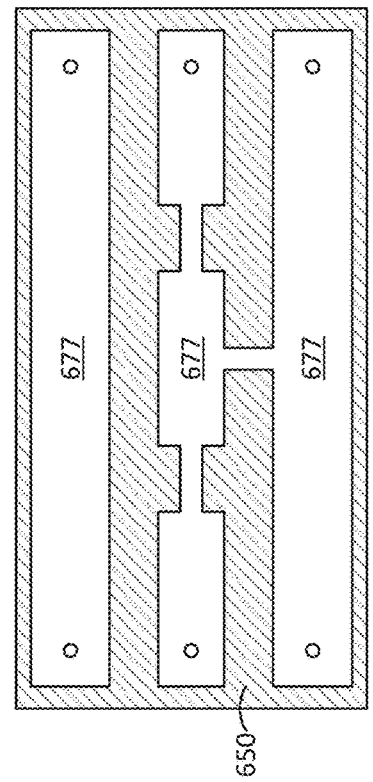

FIGS. 6A-6G show plan views of the second section of an attenuator during a fabrication process similar to that described with respect to FIG. 5. FIG. 6A shows a substrate material 650 (shown in a cross-hatched pattern) with through-holes 604a-604f formed therein (e.g., via step 500). Forming the through-holes can be performed a variety of ways, including via a mechanical punch, applying one or more laser pulses, or the like. FIG. 6B shows the substrate including a thin-film stack 677 deposited thereon (e.g., step 510).

Figure 6C:
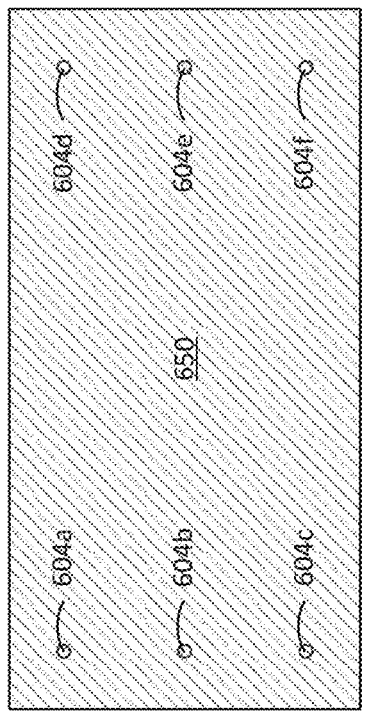
Figure 6D:
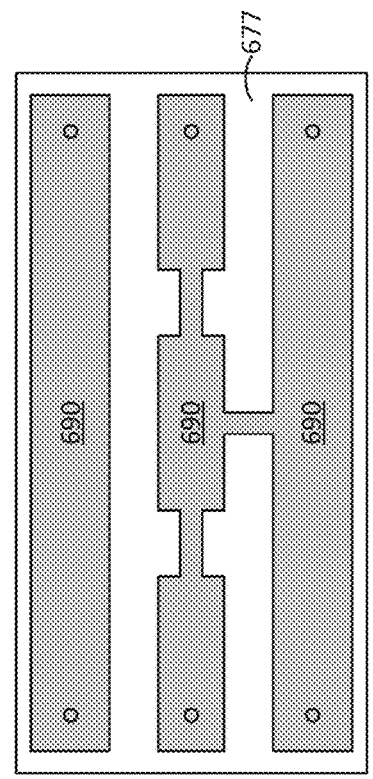

FIG. 6C shows a shaded mask 690 applied to various sections of the thin-film stack 677. After etching the thin-film stack and removing the mask, FIG. 6D shows the thin-film stack 677 remaining where the shaded mask 690 was applied in FIG. 6C, while sections of the stack 677 from FIG. 6C have been etched down to the substrate 650 (crosshatched) in FIG. 6D, such as described in step 520 in the method of FIG. 5.

Figure 6E:
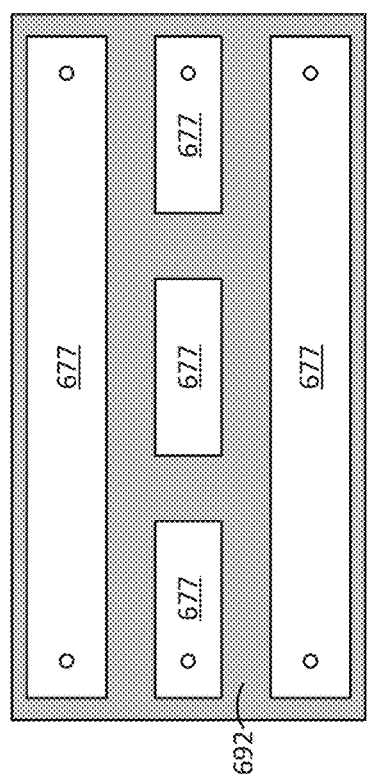
Figure 6G:
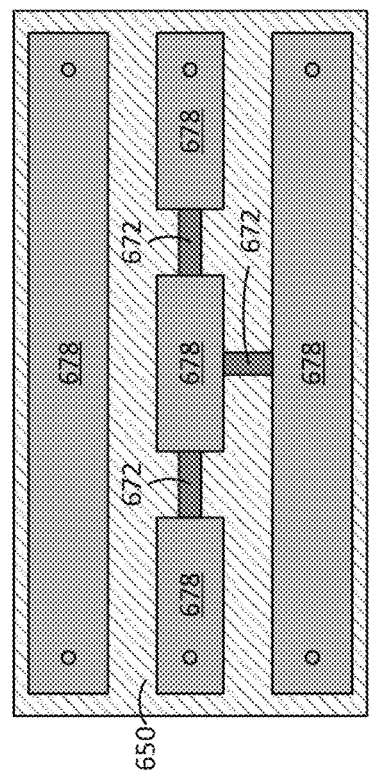
Figure 6F:
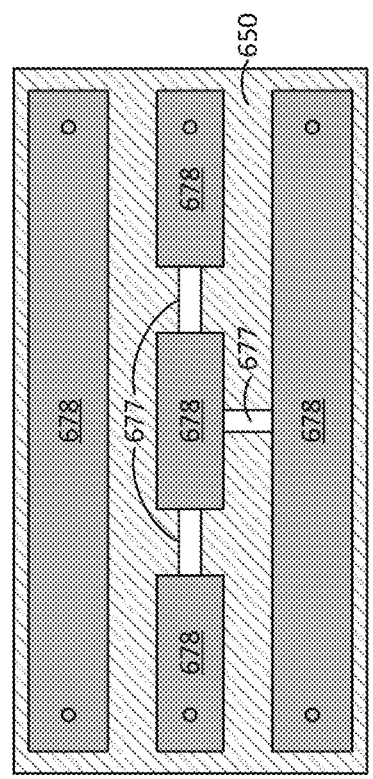

FIG. 6E shows a shaded mask 692 applied to various sections of the second portion of the attenuator, leaving remaining exposed sections of the thin-film stack 677, such as described in step 530 of FIG. 5. FIG. 6F shows that a plating layer 678 has been applied to unmasked sections (of stack 677) in FIG. 6E, while the thin-film stack 677 and substrate 650 material remains where mask 692 was applied, such as described with respect to step 540 in FIG. 5. Finally, the sections showing the thin-film stack 677 in FIG. 6F are etched to remove the conductive layer and the barrier layer in order to reveal the resistive layer at sections 672, as shown in FIG. 6G and as described in step 550. Such sections could be trimmed to a desired size as described with respect to step 570. The resulting structure after the process shown in steps represented in FIGS. 6A-6G is similar to the "tee" attenuator shown in FIG. 3A, including a plurality of resistive sections and first and second ground sections.

Similarly, FIGS. 7A-7F show plan views of the first section of an attenuator during a fabrication process similar to that described with respect to FIG. 5. The process shown in FIGS. 7A-7F can be performed simultaneously with the process shown in FIGS. 6A-6G, for example, by sputtering onto and etching both sides of an attenuator structure simultaneously.

Figure 7A:
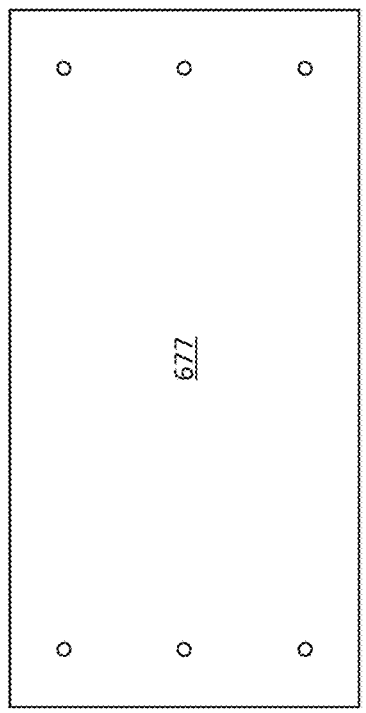
FIGS. 7A-7F show plan views of the first section of an attenuator during a fabrication process similar to that described with respect to FIG. 5.
Figure 7B:
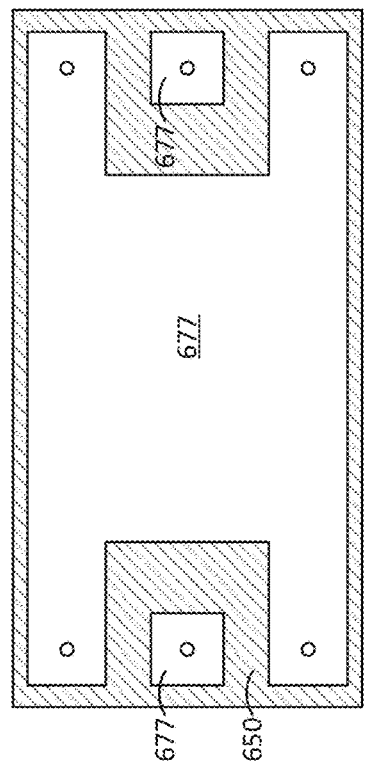

FIG. 7A shows a substrate material 650 (shown in a cross-hatched pattern) with through-holes 604a-604f formed therein (e.g., via step 500 and as shown in FIG. 6A). FIG. 7B shows the substrate including a thin-film stack 677 deposited thereon (e.g., step 510 and as shown in FIG. 6B).

Figure 7C:
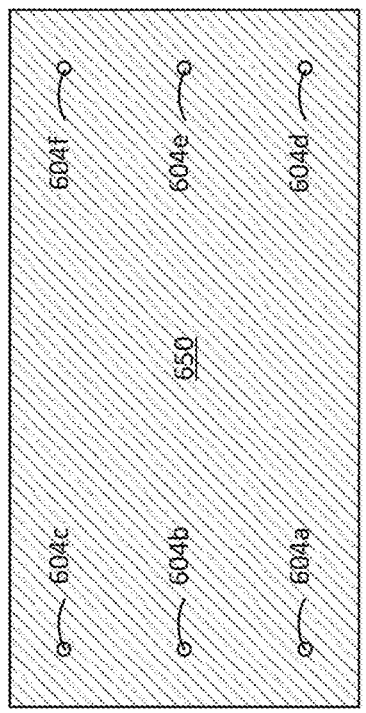
Figure 7D:
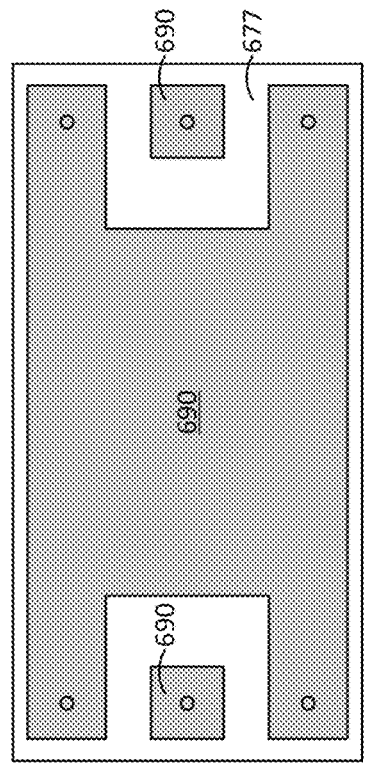

FIG. 7C shows a shaded mask 690 applied to various sections of the thin-film stack 677. After etching the thin-film stack and removing the mask, FIG. 7D shows the thin-film stack 677 remaining where the shaded mask 690 was applied in FIG. 7C, while sections of the stack 677 from FIG. 7C have been etched down to the substrate 650 (crosshatched) in FIG. 7D, such as described in step 520 in the method of FIG. 5 and shown in FIG. 6D.

Figure 7E:
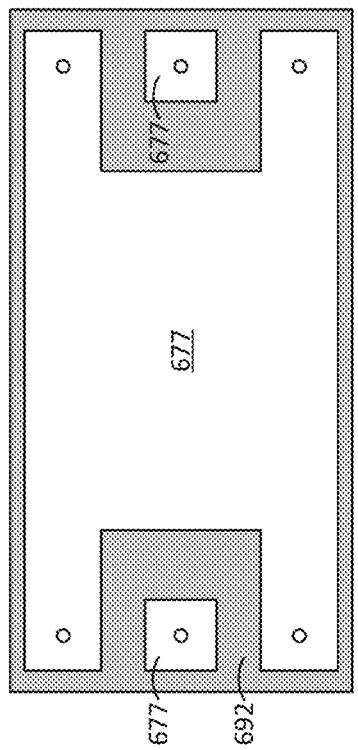
Figure 7F:
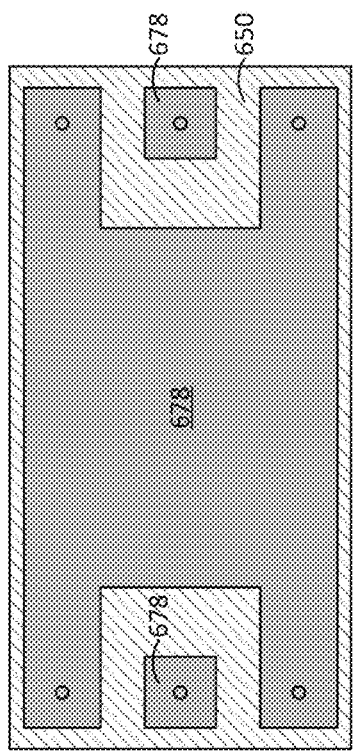

FIG. 7E shows a shaded mask 692 applied to various sections of the first portion of the attenuator, leaving remaining exposed sections of the thin-film stack 677, such as described in step 530 of FIG. 5 and shown in FIG. 6E on the second portion of the attenuator. FIG. 7F shows applying a plating layer 678 to unmasked sections (of stack 677) in FIG. 7E, while the substrate 650 material remains where mask 692 was applied, such as described with respect to step 540 in FIG. 5. The resulting structure after the process shown in steps represented in FIGS. 7A-7F is similar to the first portion of the attenuator shown in FIG. 2A, including input and output sections separated from a ground section by isolating sections including a bare substrate.

Thus, the process described in FIG. 5 can be applied to two sides of a substrate simultaneously to produce the first and second portions of an attenuator during a single processing step. For instance, the process steps performed for creating the second portion of the attenuator highlighted in FIGS. 6A, 6B, 6C, 6D, 6E, and 6F can be performed simultaneously as the process steps performed for creating the first portion of the attenuator highlighted in FIGS. 7A, 7B, 7C, 7D, 7E, and 7F, respectively.

Figure 8B:
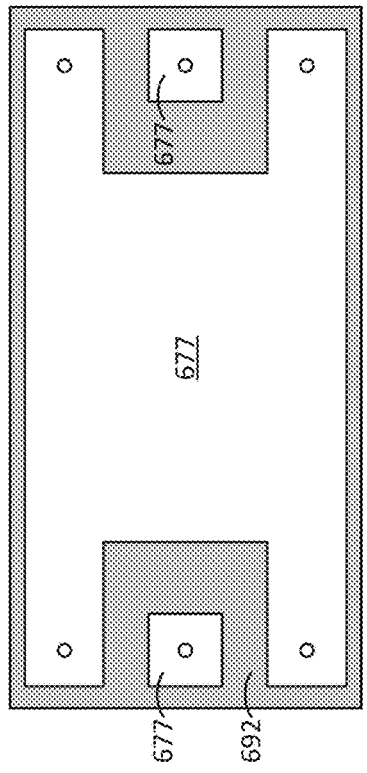
FIGS. 8A-8D show an alternative process for producing a first portion of an attenuator.
Figure 8A:
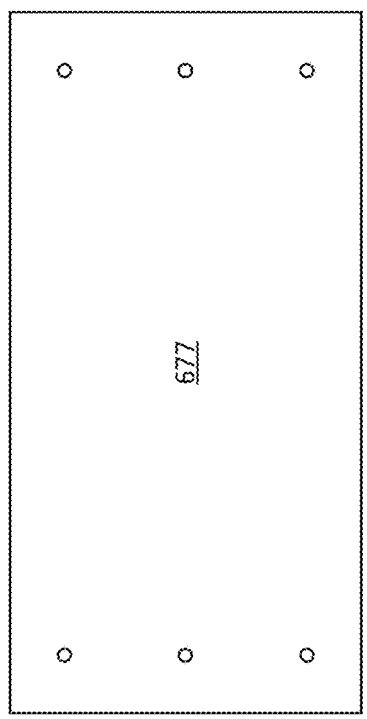
Figure 8D:
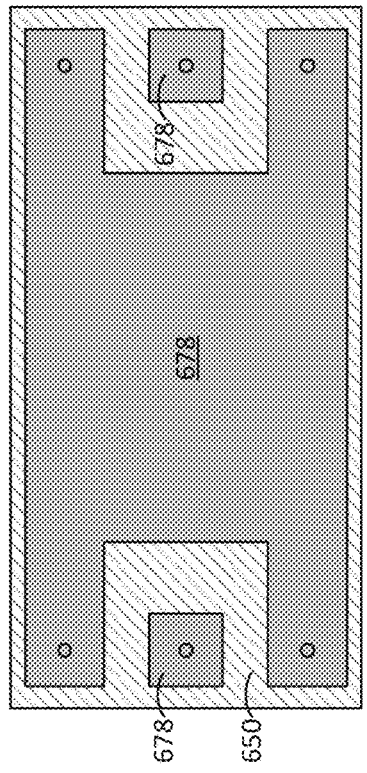
Figure 8C:
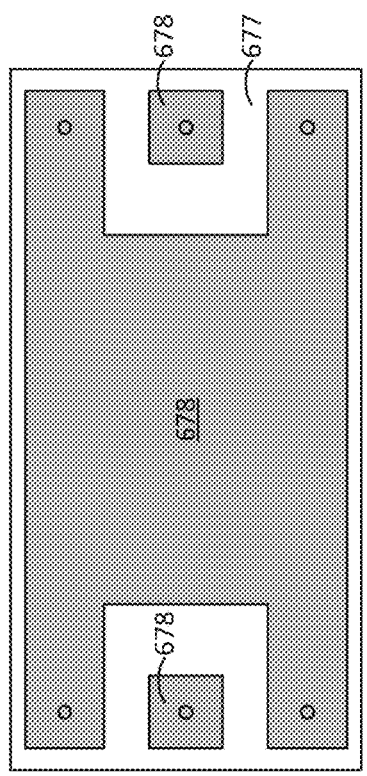

FIGS. 8A-8D show an alternative process for producing a first portion of an attenuator. FIG. 8A shows a first side of a substrate including a thin-film stack 677 including a plurality of through-holes, similar to described with respect to steps 500 and 510. FIG. 8B shows a mask 692 applied to sections to not be copper plated, similar to the mask described in step 530 of FIG. 5 and shown in FIG. 6E. In FIG. 8C, the unmasked sections are plated with plating layer 678, while thin-film stack 677 remains where mask 692 was placed. The entire thin-film stack 677 can be etched away to reveal substrate 650 as described with respect to step 560 in FIG. 5, for example, while protecting resistive sections on the second portion of the attenuator.

Figure 9A:
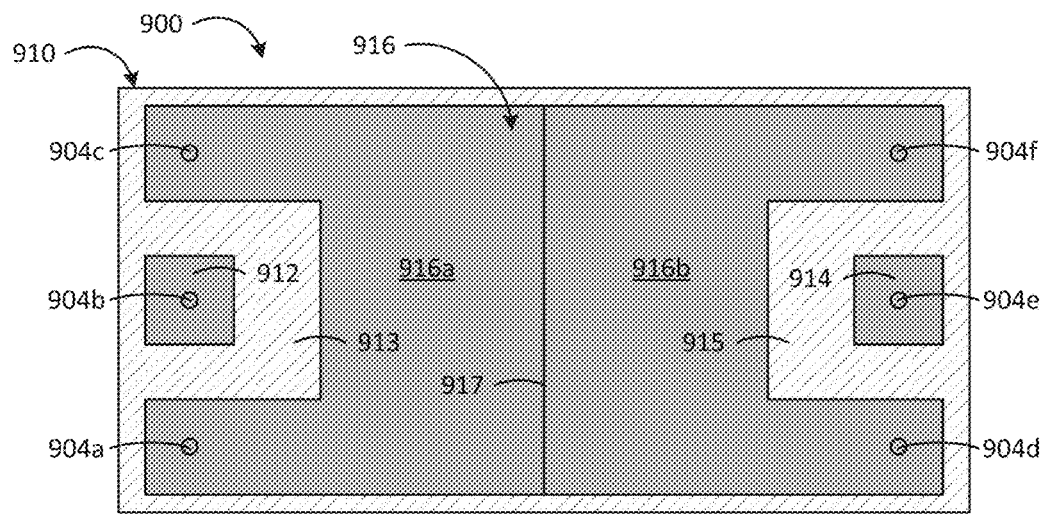
FIGS. 9A and 9B show first and second portions of an exemplary attenuator, respectively.
Figure 9B:
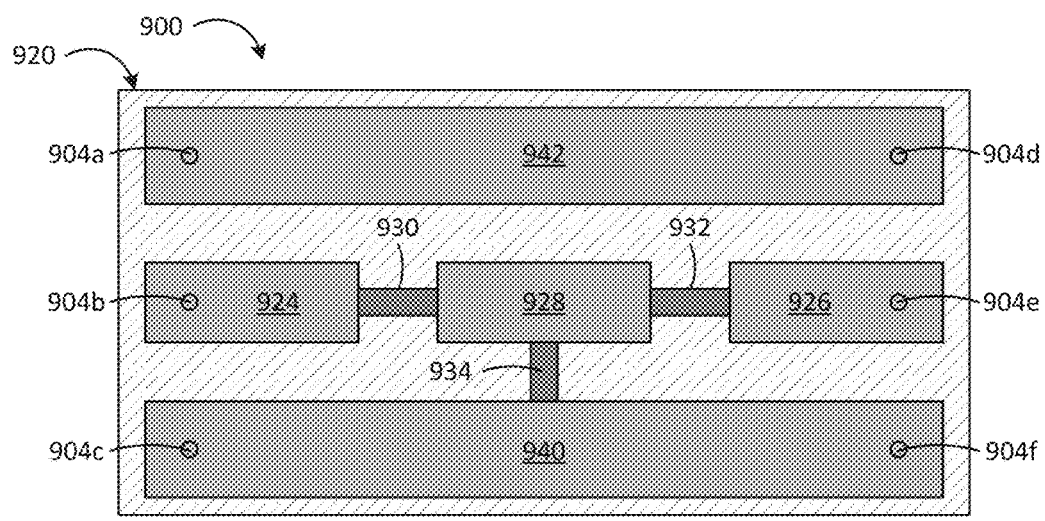

FIGS. 9A and 9B show first and second portions of an exemplary attenuator, respectively. Similar to embodiments described elsewhere herein, the attenuator of FIG. 9A shows a first portion 910 of an attenuator 900 that includes an input contact section 912, an output contact section 914, and a ground section 916. In some examples, ground section 916 includes one or more separate sections 916a, 916b separated by a cut or gap 917 in the ground section 916. Such a cut or gap 917 can be formed during an etching process such as during step 520 or 560 in FIG. 5. Ground section 916 is separated from input contact section 912 via isolating section 913, and from output contact section 914 via isolating section 915. In some embodiments, input contact section 912, output contact section 914, and ground section 916 include a plating layer, applied, for example, as described in step 540 in FIG. 5.

FIG. 9B shows a second portion 920 of an attenuator 900 that includes a first ground section 940 and a second ground section 942. The second portion 920 includes an input section 924, an output section 926, and an intermediate section 928. In some examples, input section 924, output section 926, and intermediate section 928 include a plating layer applied, for example, as described in step 540 in FIG. 5 and shown in FIG. 6F.

The attenuator 900 in FIGS. 9A and 9B comprises a "tee" attenuator. The second portion 920 includes a first resistive section extending between the input section 924 and the intermediate section 928, a second resistive section extending between the intermediate section 928 and the output section 926, and a third resistive section extending between the intermediate section 928 and the first ground section 940. Resistive sections 930, 932, 934 can include a resistive layer and can be formed, for example, by etching down a stack of materials to reveal the resistive layer, such as described with respect to step 550 in FIG. 5 and as shown in FIG. 6G.

The attenuator comprises a plurality of through-holes 904a, 904b, 904c, 904d, 904e, 904f extending between the first portion 910 and the second portion 920. As described elsewhere herein, through-holes 904a-904f can include an electrically conductive coating to facilitate electrical communication between the first portion 910 and the second portion 920. For example, in the illustrated example of FIGS. 9A and 9B, through-holes 904a and 904d provide electrical communication between the ground section 916 of the first portion 910 and the second ground section 942 in the second portion 920. Similarly, through-holes 904c and 904f provide electrical communication between the ground section 916 of the first portion 910 and the first ground section 940 in the second portion 920. Thus, first ground section 940 and second ground section 942 in FIG. 9B are electrically coupled via through-holes 904a, 904c, 904d, 904f; and the ground section 916. This provides a G-S-G configuration on the second portion 920 of the attenuator 900.

Additionally, through-hole 904b provides electrical communication between input contact section 912 of the first portion 910 and input section 924 of the second portion 920. Similarly, through-hole 904e provides electrical communication between output contact section 914 of the first portion 910 and output section 926 of the second portion 920.

During operation, attenuator 900 can be surface mounted onto a circuit board with the first portion 910 facing down onto the board, such as in a land grid array. A signal to be attenuated via attenuator 900 can be received at the input contact section 904 and communicated to the input section 924 via through-hole 904b. The signal can be attenuated via transmission across the "tee" attenuator configuration including intermediate section 928 and resistive sections 930, 932, 934. As described, first ground section 940 and second ground section 942 on either side of intermediate section 928 and resistive sections 930, 932, 934 provide a G-S-G configuration to facilitate high frequency signal attenuation with reduced loss. The attenuated signal can be received at output section 926 and communicated to output contact section 914 via through-hole 904e. Output contact section 914 can transmit the attenuated signal back to the circuit board, for instance, via a direct contact to the surface of the board.

Fabrication and operation of a "tee" structure have been described and shown with respect to FIGS. 6A-D and 9. However, it will be appreciated that similar fabrication processes will be applicable for other attenuators, such as "pi" attenuators (e.g., as shown in FIG. 3B), "dual pi" attenuators (e.g., as shown in FIG. 3C), and the like. The ground-signal-ground (G-S-G) configuration of the attenuators, as well as the backing ground section on the first portion of the attenuators and the plating layer, reduce various losses often experienced with thin-film attenuators when attenuating high frequency signals. Processes described herein can be used to fabricate such high-frequency thin-film attenuators, for example, on a surface mount chip.

In various examples, the specific plan arrangement of various sections, such as the size and positions of various resistive sections, can be adjusted in order to customize the attenuation properties of the attenuator. For example, the geometry of thin film resistive sections can be adjusted to achieve a desired sheet resistance across a given resistive section. In various examples, the shape, size, and/or location of various sections (e.g., input section 924, intermediate section 928, output section 926, etc.) can be adjusted to facilitate the desired geometric configuration of resistive sections extending therebetween.

In some embodiments, different attenuator configurations (e.g., "tee," "pi," etc.) can best facilitate a desired level of attenuation, for example, due to physical limitations for achieving appropriate resistance values within a single thin-film attenuator chip. For instance, in some implementations, 1 dB and 2 dB attenuators are configured using a "tee" attenuator design, 3 dB, 4 dB, 5 dB, 6 dB, and 7 dB attenuators are configured using a "pi" attenuator design, and 8 dB, 9 dB, and 10 dB attenuators are configured using a "dual pi" attenuator design.

It will be appreciated that various thin-film deposition techniques could be used to fabricate thin-film attenuators as described herein, such as by vapor deposition, vacuum deposition, evaporation, screen printing, electroplating, immersion plating/coating, organic material growth, foil processing, or other known processes. In general, various processes that can be used to deposit thin-film layers of a desired thickness may be used in fabricating thin-film attenuators.

Additionally, while often described as being fabricated using thin-film deposition techniques followed by various masking and etching steps (e.g., destructive fabrication), in some embodiments, one or more attenuator designs described herein could be fabricated using additive fabrication techniques. For instance, combinations of masking and depositing steps, 3D printing techniques, thick-film fabrication techniques, or the like could be used to make larger scale versions of such attenuator chips. In general, one or more thick-film, thin-film, metallization, or other resistive element and conductive element constructive processes can be used to build various devices as described herein.

Figure 10:
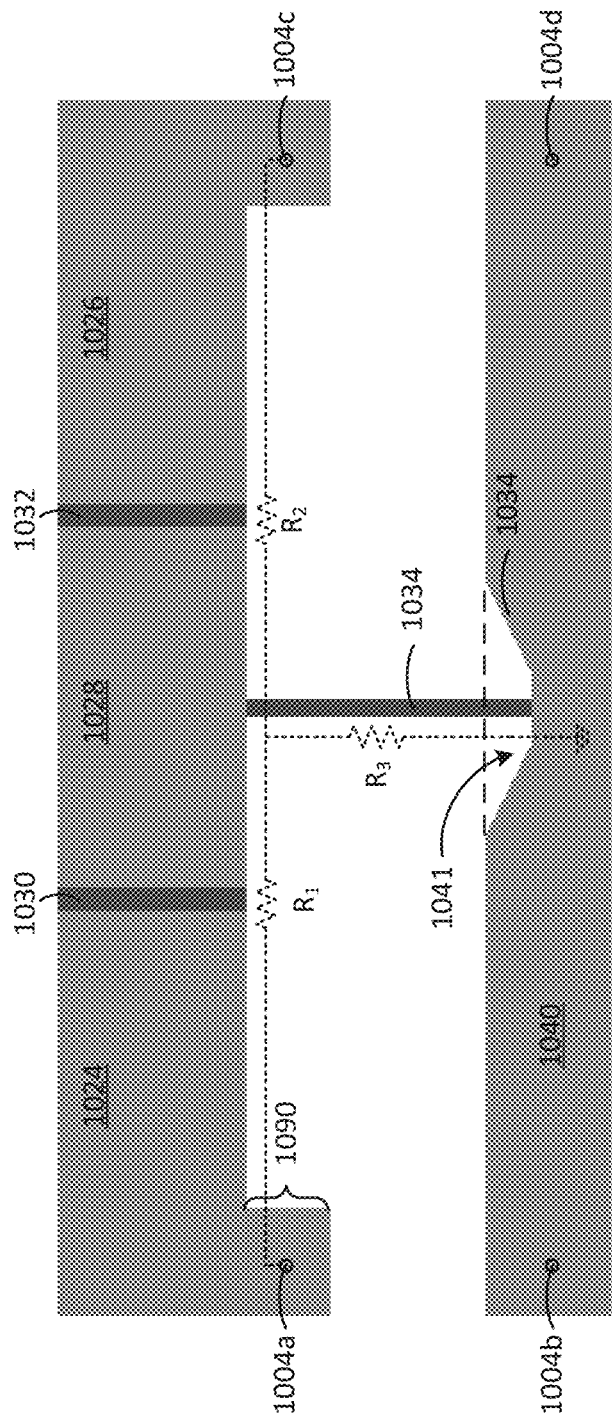
FIG. 10 shows a second portion of an exemplary "tee" attenuator.
Figure 11:
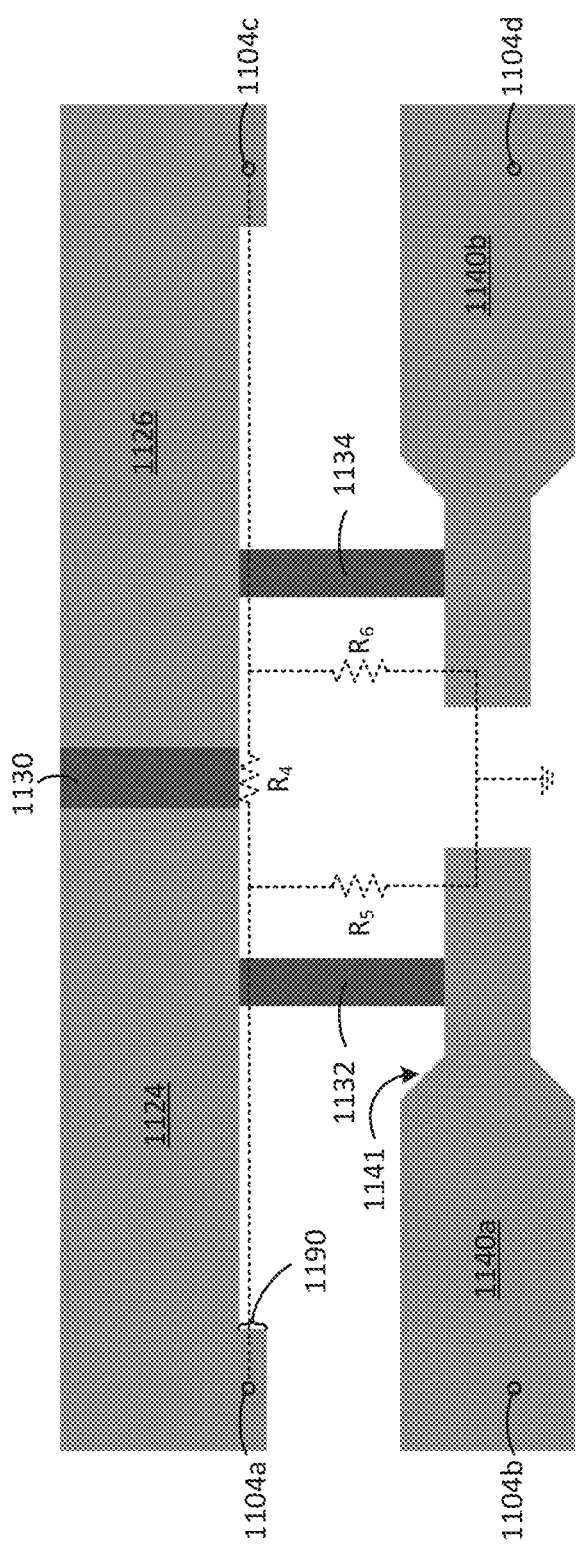
FIG. 11 shows a second portion of an exemplary "pi" attenuator.
Figure 12:
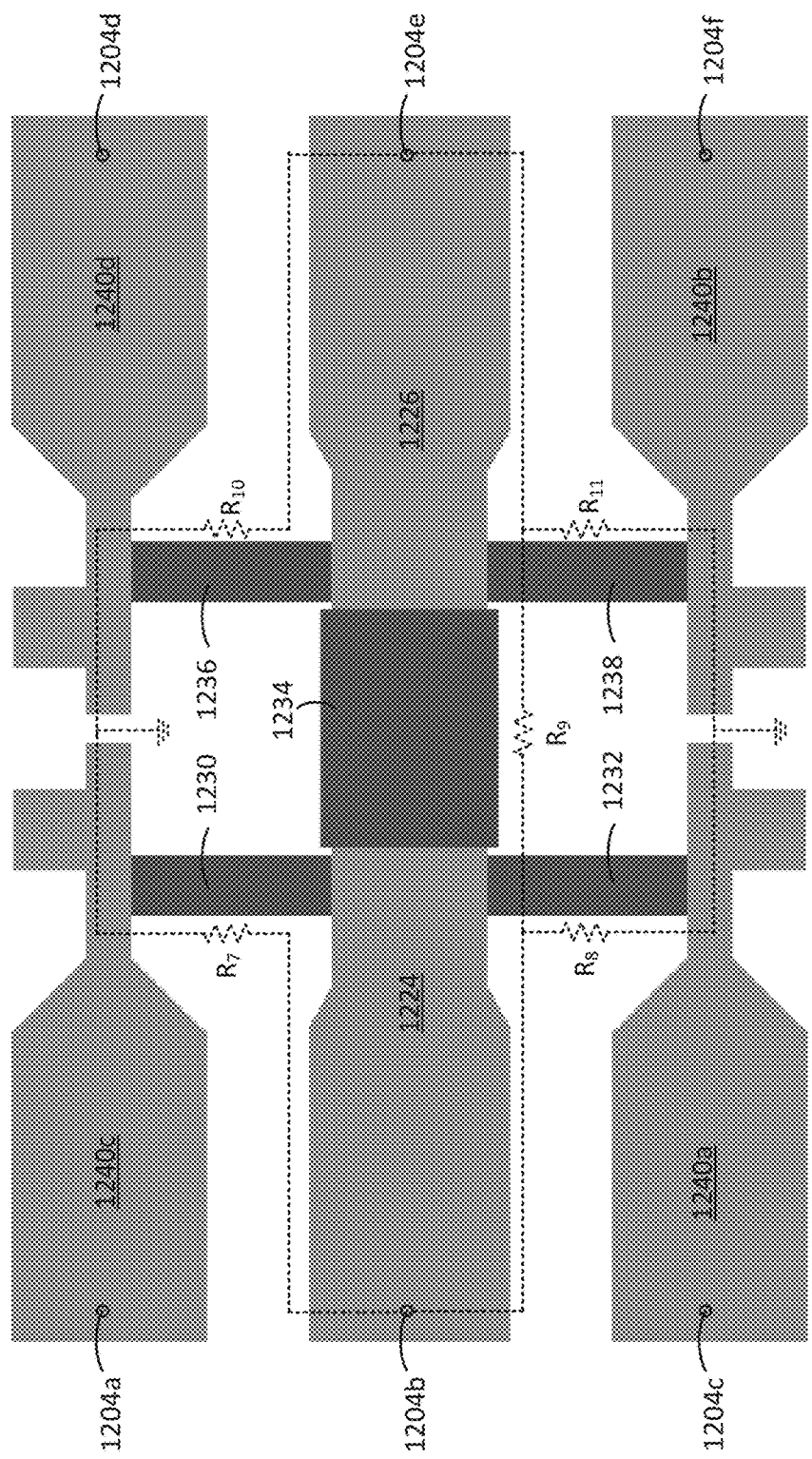
FIG. 12 shows a second portion of an exemplary "dual pi" attenuator.

Various exemplary features and fabrication techniques have been described. FIGS. 10-12 show a series of second portions of exemplary attenuator configurations. FIG. 10 shows a second portion of an exemplary "tee" attenuator. In the illustrated example, attenuator includes an input section 1024 having a first through-hole 1004a for receiving an input signal to be attenuated, for example, from an input connection section on a bottom side of the attenuator. The attenuator further includes an output section 1026 having a third through-hole 1004c for communicating an attenuated signal, for example, to an output connection section on a bottom side of the attenuator. The attenuator includes a ground section 1040. In some embodiments, the attenuator could further include a second ground section (not shown) positioned generally opposite ground section 1040. Ground section 1040 includes a second through-hole 1004b and a fourth through-hole 1004d for grounding the ground section 1040 to a ground section on the bottom side of the attenuator.

The attenuator of FIG. 10 includes an intermediate section 1028, a first resistive section 1030 between the input section 1024 and the intermediate section 1028, a second resistive section 1032 between the intermediate section 1028 and the output section 1026, and a third resistive section 1034 between the intermediate section 1028 and the ground section 1040. The first 1030, second 1032, and third 1034 resistive sections, together with the intermediate section 1038, form a "tee" attenuator between the input section 1024 and the output section 1026, and similarly between first through-hole 1004a and third through-hole 1004c.

In the illustrated example, the input section 1024 has an extension 1090 extending from the first through-hole 1004a and effectively moving the signal flow path further away from the ground section 1040 and extending the length of third resistive section 1034 required to extend from the intermediate section 1028 to the ground section 1040. Similarly, ground section 1040 includes cutaway section 1041 proximate the location that the third resistive section 1034 meets ground section 1040. Extension 1090 and cutaway section 1041 effectively increase the length of third resistive section 1034. Reducing the amount that cutaway section 1041 cuts into the ground section 1040 and/or reducing the length of the extension 1090 would effectively shorted the length of third resistive section 1034. Varying the length of third resistive section 1034 changes the resistance of the resistive section, and can be adjusted according to desired attenuation properties. Similarly, the widths and/or lengths of first resistive section 1030 and/or second resistive section 1032 can be adjusted to adjust the resistance of such sections, and similarly, the attenuation properties of the attenuator.

FIG. 10 includes a schematic trace of a circuit diagram showing the "tee" attenuator configuration. As shown, the schematic circuit includes resistors $R_1$ (corresponding to first resistive section 1030), $R_2$ (corresponding to second resistive section 1032), and $R_3$ (corresponding to third resistive section 1034). It will be appreciated that, in such a "tee" configuration attenuator, adjusting the values of resistors $R_1$, $R_2$, or $R_3$ will adjust the attenuation characteristics of the attenuator. Thus, adjusting the geometry of resistive sections 1030, 1032, and/or 1034 can similarly impact the attenuation characteristics of the attenuator.

FIG. 11 shows a second portion of an exemplary "pi" attenuator. In the illustrated example, attenuator includes an input section 1124 having a first through-hole 1104a for receiving an input signal to be attenuated, for example, from an input connection section on a bottom side of the attenuator. The attenuator further includes an output section 1126 having a third through-hole 1104c for communicating an attenuated signal, for example, to an output connection section on a bottom side of the attenuator. The attenuator includes first ground section 1140a and second ground section 1140b. In some embodiments, the attenuator could further include one or more additional ground sections (not shown) positioned generally opposite ground sections 1140a and 1140b. First ground section 1140a includes second through-hole 1104b, and second ground section 1140b includes a fourth through-hole 1104d for grounding the first and second ground sections 1140a and 1140b to a ground section on the bottom side of the attenuator. In some examples, the ground section on the bottom side of the attenuator (e.g., in a first portion of the attenuator) electrically couples first and second ground sections 1140a and 1140b via second through-hole 1104b and fourth through-hole 1104d.

The attenuator of FIG. 11 includes a first resistive section 1130 between the input section 1124 and the output section 1126, a second resistive section 1132 between the input section 1124 and the first ground section 1140a, and a third resistive section 1134 between the output section 1126 and the second ground section 1140b. The first 1130, second 1132, and third 1134 resistive sections form a "pi" attenuator between the input section 1124 and the output section 1126, and similarly between first through-hole 1104a and third through-hole 1104c.

FIG. 11 includes a schematic trace of a circuit diagram showing the "pi" attenuator configuration. As shown, the schematic circuit includes resistors $R_4$ (corresponding to first resistive section 1130), $R_5$ (corresponding to second resistive section 1132), and $R_6$ (corresponding to third resistive section 1134). It will be appreciated that, in such a "pi" configuration attenuator, adjusting the values of resistors $R_4$, $R_5$, or $R_6$ will adjust the attenuation characteristics of the attenuator. Thus, adjusting the geometry of resistive sections 1130, 1132, and/or 1134 can similarly impact the attenuation characteristics of the attenuator. For example, similar to as discussed with respect to the exemplary "tee" attenuator in FIG. 10, adjustments to various dimensional characteristics of one or more sections, such as the input section 1124, output section 1126, first ground section 1140a, or second ground section 1140b can customize the resistance of the resistive sections 1130, 1132, 1134 of the attenuator, and thus the attenuating characteristics of the attenuator. For example, extension 1190 on the input section 1124 and cutaway section 1141 act to increase the length of the second resistive section 1132 between the input section 1124 and the first ground section 1140a compared to if such sections extended straight across along the attenuator. In the illustrated example, similar geometry is included on the output section 1126 and second ground section 1140b.

FIG. 12 shows a second portion of an exemplary "dual pi" attenuator. In the illustrated example, attenuator includes an input section 1224 having a second through-hole 1204b for receiving an input signal to be attenuated, for example, from an input connection section on a bottom side of the attenuator. The attenuator further includes an output section 1226 having a fifth through-hole 1204e for communicating an attenuated signal, for example, to an output connection section on a bottom side of the attenuator.

The attenuator includes first ground section 1240a, a second ground section 1240b, a third ground section 1240c, and a fourth ground section 1240d. In the illustrated embodiment, first ground section 1240a includes a third through-hole 1204c, second ground section 1240b includes a sixth through-hole 1204f for grounding the first and second ground sections 1240a and 1240b to a ground section on the bottom side of the attenuator. Similarly, third ground section 1240c includes first through-hole 1204a and fourth ground section 1240d includes a fourth through-hole 1204d for grounding the third and fourth ground sections 1240c and 1240d to a ground section on the bottom side of the attenuator.

In some examples, the ground section on the bottom side of the attenuator (e.g., in a first portion of the attenuator) electrically couples first ground section 1240a, the second ground section 1240b, the third ground section 1240c, and the fourth ground section 1240d, for example, via through-holes 1204a, 1204c, 1204d, and 1204f.

The attenuator of FIG. 12 includes a first resistive section 1230 between the input section 1224 and the third ground section 1240c, a second resistive section 1232 between the input section 1224 and the first ground section 1240a, and a third resistive section 1234 between the input section 1224 and the output section 1226. The attenuator further includes a fourth resistive section 1236 between the output section 1226 and the fourth ground section 1240d and a fifth resistive section 1238 between the output section 1226 and the second ground section 1240b. The first 1230, second 1232, third 1234, fourth 1236, and fifth 1238 resistive sections form a "dual pi" attenuator between the input section 1224 and the output section 1226, and similarly between through-holes 1204b and 1204e.

FIG. 12 includes a schematic trace of a circuit diagram showing the "dual pi" attenuator configuration. As shown, the schematic circuit includes resistors $R_7$ (corresponding to first resistive section 1230), $R_8$ (corresponding to second resistive section 1232), $R_9$ (corresponding to third resistive section 1234), $R_{10}$ (corresponding to fourth resistive section 1236), and $R_{11}$ (corresponding to fifth resistive section 1238). It will be appreciated that, in such a "dual pi" configuration attenuator, adjusting the values of resistors $R_7$, $R_8$, $R_9$, $R_{10}$, or $R_{11}$ will adjust the attenuation characteristics of the attenuator. Thus, adjusting the geometry of resistive sections 1230, 1232, 1234, 1236, and/or 1238 can similarly impact the attenuation characteristics of the attenuator, for example, by one or more extensions and/or cutaway sections as described with respect to FIGS. 10 and 11. For example, similar to as discussed with respect to the exemplary "tee" attenuator in FIG. 10, adjusting various dimensional characteristics of one or more sections, such as the input section 1224, output section 1226, first ground section 1240*a*, second ground section 1240*b*, third ground section 1240*c*, or fourth ground section 1240*d* can customize the resistance of the resistive sections 1230, 1232, 1234, 1236, and/or 1238 of the attenuator, and thus the attenuating characteristics of the attenuator.

In the illustrative examples of FIGS. 10-12, the attenuators are generally shows as being substantially symmetrical. For instance, in various embodiments and as described elsewhere herein, sections of the attenuator (e.g., resistive sections) can comprise the same layer(s) of the same material(s) at approximately the same thickness(es). In some examples, resistive sections (e.g., 1030, 1032, 1034 in FIG. 10) each comprise approximately the same thickness of a resistive material, such as shown in resistive layer 372 in FIG. 4A. In some such examples, different resistance values for different resistive sections can be achieved by adjusting the dimensions of the resistive sections. In such configurations, attenuators that are approximately structurally symmetric in the direction of signal propagation will likely also be symmetric with respect to attenuation of signals. Accordingly, in some embodiments, attenuator chips can be manufactured to be approximately symmetric such that the attenuator will attenuate signals approximately equally in either direction of signal propagation through chip. For instance, in an exemplary embodiment, with respect to FIG. 12, resistance values $R_7=R_{10}$ and $R_8=R_{11}$ to promote symmetry in the attenuator. Similarly, with respect to FIG. 11, in some embodiments, resistance values $R_4=R_6$ to promote attenuator symmetry, and with respect to FIG. 10, in some embodiments, $R_1=R_2$ to promote attenuator symmetry.

Various examples have been described. The figures and descriptions herein are exemplary in nature and do not limit the scope of the invention in any way. Moreover, the drawings of various embodiments are intended to show features and views of various embodiments described herein, and are not necessarily drawn to scale unless explicitly stated. Such examples are provided to demonstrate various possible configurations and implementations within the scope of the following claim(s).

The invention claimed is:

1. A passive, high frequency attenuator comprising:
   a substrate comprising a substrate material having a first side and a second side, the second side being opposite the first;
   a first portion coupled to the first side of the substrate, the first portion comprising:
   an input contact section;
   an output contact section; and
   a ground section;
   a second portion coupled to the second side of the substrate, the second portion comprising:
   a first ground section positioned along a first edge of the second side of the substrate;
   a second ground section positioned along a second edge of the second side of the substrate, the second edge being opposite the first edge; and
   an attenuation section positioned between the first and second ground sections, the attenuation section comprising:
   an input section;
   an output section; and
   a plurality of resistive sections positioned between the input section, the output section, and the first ground section; and
   a plurality of through-holes extending through the substrate and providing electrical communication between the first side of the substrate and the second side of the substrate; and wherein
   the input contact section of the first portion is in electrical communication with the input section of the attenuation section of the second portion;
   the output contact section of the first portion is in electrical communication with the output section of the attenuation section of the second portion; and
   the ground section of the first portion is in electrical communication with the first ground section of the second portion and the second ground section of the second portion.

2. The attenuator of claim 1, wherein the attenuation section comprises:
   a first resistive section providing communication between the input section and the first ground section;
   a second resistive section providing communication between the input section and the output section; and
   a third resistive section providing communication between the output section and the first ground section.

3. The attenuator of claim 2, wherein the attenuation section further comprises:
   a fourth resistive section providing communication between the input section and the second ground section; and
   a fifth resistive section providing communication between the output section and the second ground section.

4. The attenuator of claim 1, wherein there are no resistive sections providing communication between the input section and the second ground section or between the output section and the second ground section.

5. The attenuator of claim 4, wherein the attenuation section comprises:
   an intermediate section;
   a first resistive section providing communication between the input section and the intermediate section;
   a second resistive section providing communication between the intermediate section and the first ground section; and
   a third resistive section providing communication between the intermediate section and the output section.

6. The attenuator of claim 1, wherein the plurality of through-holes comprises:
   a first through-hole providing electrical communication between the input contact section of the first portion and the input section of the second portion;
   a second through-hole providing electrical communication between the output contact section of the first portion and the output section of the second portion;

a third through-hole providing electrical communication between the ground section of the first portion and the first ground section of the second portion; and
a fourth through-hole providing electrical communication between the ground section of the first portion and the second ground section of the second portion.

7. The attenuator of claim 6, wherein
the ground section on the first portion comprises a cut or gap dividing the ground section into separate ground sections;
the third through-hole provides electrical communication between a first of the separate ground sections of the first portion and the first ground section of the second portion; and
the plurality of through-holes further comprises a fifth through-hole providing electrical communication between a second of the separate ground sections of the first portion and the first ground section of the second portion.

8. The attenuator of claim 6, wherein
the ground section on the first portion comprises a cut or gap dividing the ground section into separate ground sections;
the fourth through-hole provides electrical communication between a first of the separate ground sections of the first portion and the second ground section of the second portion; and
the plurality of through-holes further comprises a fifth through-hole providing electrical communication between a second of the separate ground sections of the first portion and the second ground section of the second portion.

9. The attenuator of claim 1, wherein each of the first ground section, the input section, and the output section of the attenuation section of the second portion includes a first stack of materials and the plurality of resistive sections of the attenuation section of the second portion include a second stack of materials.

10. The attenuator of claim 9, wherein the first stack of materials comprises:
a thin-film resistive layer coupled to the second side of the substrate, a thin-film barrier layer coupled to the thin-film resistive layer, a thin-film conductive layer coupled to the thin-film resistive layer, and a plating layer coupled to the thin-film conductive layer; and
the second stack of materials comprises the thin-film resistive layer and does not include the thin-film barrier layer, the thin-film conductive layer, or the plating layer.

11. The attenuator of claim 10, wherein the second stack of materials is a subset of the first stack of materials.

12. The attenuator of claim 1, wherein each of the plurality of through-holes is internal to a perimeter of the attenuator such that the perimeter of the attenuator does not intersect any of the plurality of through-holes.

13. A passive, high frequency attenuator comprising:
a substrate comprising a substrate material having a first side and a second side, the second side being opposite the first;
a first portion coupled to the first side of the substrate and comprising a ground section;
a second portion coupled to the second side of the substrate, the second portion comprising:
a first ground section positioned along a first edge of the second side of the substrate;
a second ground section positioned along a second edge of the second side of the substrate; and
an attenuation section positioned between the first and second ground sections, the attenuation section comprising
an input section;
an output section; and
a plurality of resistive sections providing electrical communication between the input section, the output section, and the first ground section;
a first through-hole extending through the substrate and providing electrical communication between the ground section on the first side of the substrate and the first ground section on the second side of the substrate; and
a second through-hole extending through the substrate and providing electrical communication between the ground section on the first side of the substrate and the second ground section on the second side of the substrate; such that
the first ground section and the second ground section on the second side of the substrate are electrically coupled to one another via the first through-hole, the second through-hole, and the ground section on the first side of the substrate.

14. The attenuator of claim 13, wherein the first portion coupled to the first side of the substrate comprises an input contact section and an output contact section.

15. The attenuator of claim 14, further comprising:
a third through-hole extending through the substrate and providing electrical communication between the input contact section of the first portion and the input section of the attenuation section; and
a fourth through-hole extending through the substrate and providing electrical communication between the output contact section of the first portion and the output section of the attenuation section.

16. The attenuator of claim 13, wherein the plurality of resistive sections comprises:
a first resistive section between the input section and the first ground section;
a second resistive section between the input section and the output section; and
a third resistive section between the output section and the first ground section.

17. The attenuator of claim 16, wherein the plurality of resistive sections further comprises:
a fourth resistive section between the input section and the second ground section; and
a fifth resistive section between the output section and the second ground section.

18. A passive, high frequency attenuator comprising:
a substrate comprising a substrate material having a first side and a second side, the second side being opposite the first;
a first portion coupled to the first side of the substrate, the first portion comprising:
an input contact section;
an output contact section; and
a ground section;
a second portion coupled to the second side of the substrate, the second portion comprising:
a first ground section positioned along a first edge of the second side of the substrate;
a second ground section positioned along a second edge of the second side of the substrate, the second edge being opposite the first edge; and an attenuation section positioned between the first and second ground sections, the attenuation section comprising:

an input section;

an output section; and a plurality of resistive sections positioned between the input section, the output section, and the first ground section; and a first through-hole extending through the substrate and providing electrical communication between the input contact section of the first portion and the input section of the attenuation section; and a second through-hole extending through the substrate and providing electrical communication between the output contact section of the first portion and the output section of the attenuation section; wherein each of the first and second through-holes is internal to a perimeter of the attenuator such that the perimeter of the attenuator does not intersect either the first or the second through-hole.

19. The attenuator of claim 18, further comprising:

a third through-hole extending through the substrate and providing electrical communication between the first ground section of the second portion and the ground section of the first portion; and a fourth through-hole extending through the substrate and providing electrical communication between the second ground section of the second portion and the ground section of the first portion.

20. The attenuator of claim 19, wherein:

the ground section on the first portion comprises a cut or gap dividing the ground section into separate ground sections comprising a first of the separate ground sections and a second of the separate ground sections, the third through-hole provides electrical communication between the first ground section of the second portion and the first of the separate ground sections of the first portion; and the attenuator further comprises a fifth through-hole extending through the substrate and providing electrical communication between the first ground section of the second portion and the second of the separate ground sections of the first portion.

* * * * *